(12) United States Patent
Uneno

(10) Patent No.: US 8,418,517 B2
(45) Date of Patent: Apr. 16, 2013

(54) METHOD OF MANUFACTURING A PIPE COUPLING COMPONENT

(75) Inventor: Daisuke Uneno, Oyama (JP)

(73) Assignee: Showa Denko K.K., Tokyo (JP)

(*) Notice: Subject to any disclaimer, the term of this patent is extended or adjusted under 35 U.S.C. 154(b) by 238 days.

(21) Appl. No.: 12/735,466

(22) PCT Filed: Feb. 17, 2009

(86) PCT No.: PCT/JP2009/052635
§ 371 (c)(1),
(2), (4) Date: Jul. 19, 2010

(87) PCT Pub. No.: WO2009/104575
PCT Pub. Date: Aug. 27, 2009

(65) Prior Publication Data
US 2010/0320753 A1    Dec. 23, 2010

(30) Foreign Application Priority Data

Feb. 19, 2008  (JP) .................................. 2008-036864
Mar. 31, 2008  (JP) .................................. 2008-089866

(51) Int. Cl.
*B21C 37/06* (2006.01)
*B21D 22/00* (2006.01)

(52) U.S. Cl.
USPC ............................................ 72/368; 72/350

(58) Field of Classification Search .......... 72/308, 72/347–350, 379.2; 29/890.14, 557
See application file for complete search history.

(56) References Cited

U.S. PATENT DOCUMENTS 3,457,761 A * 7/1969 Brosseit ..................... 72/350

FOREIGN PATENT DOCUMENTS

| JP | 60-33831 A | * | 2/1985 |
| JP | 62-34690 | | 2/1987 |
| JP | 63-154985 | | 10/1988 |
| JP | 02-274373 A | | 11/1990 |
| JP | 7-280484 A | | 10/1995 |
| JP | 2000-055255 A | | 2/2000 |
| JP | 2005-274120 A | | 10/2005 |
| JP | 2008-224134 A | | 9/2008 |

OTHER PUBLICATIONS

International Search Report dated May 26, 2009, issued on PCT/JP2009/052635.

* cited by examiner

*Primary Examiner* — Teresa M Ekiert
(74) *Attorney, Agent, or Firm* — Edwards Wildman Palmer LLP; James E. Armstrong, IV; George N. Chaclas

(57) ABSTRACT

A method of manufacturing a pipe coupling that prevents leakage including: forming a semi-tubular portion and flat portions along opposite sides of the semi-tubular portion; deforming the flat portions to produce larger bending depth and smaller width; bending portions of the flat portions so that the bent portions form acute angles in relation to the semi-tubular portion with sloping flat portions extending from the semi-tubular portion, and distal narrow flat portions; pushing the sloping flat portions away from the semi-tubular portion; pressing the semi-tubular portion, the sloping flat portions, and the narrow flat portions to produce a final shape; and removing burrs so that the semi-tubular portion of the final shape comes into close contact with an outer circumferential surface of a pipe, and the final flat portions are integrally formed along opposite side edges of the semi-tubular portion in a common plane.

11 Claims, 17 Drawing Sheets

METHOD OF MANUFACTURING A PIPE COUPLING COMPONENT

TECHNICAL FIELD

The present invention relates to a method of manufacturing a pipe coupling component used in a liquid-cooled-type cooling device for cooling a heat-generating body composed of an electronic component such as a semiconductor device, and to a method of manufacturing a casing structural member of the cooling device.

BACKGROUND ART

A conventionally known liquid-cooled-type cooling apparatus for cooling an electronic component comprises a casing composed of a top wall, a bottom wall, and a circumferential wall; a tube disposed in the casing; and inlet and outlet pipes connected to the circumferential wall of the casing, wherein the casing is composed of a box-shaped main body that opens upward and forms the bottom wall and the circumferential wall, and a lid for closing the opening of the main body; through holes are formed in the circumferential wall of the main body; and end portions of the inlet and outlet pipes are inserted into the through holes, and are brazed to the circumferential wall (see Patent Document 1).

However, the liquid-cooled-type cooling apparatus disclosed in Patent Document 1 has a problem in that the formation of the main body of the casing is difficult. In order to solve such a problem, there has been conceived a liquid-cooled-type cooling apparatus which comprises a casing, and fluid flow pipes. The casing includes a casing main body and fluid passage sections provided on the casing main body. The casing main body is composed of a top wall, a bottom wall, and a circumferential wall, and fluid flows through the interior of the casing main body. Each of the fluid passage sections is composed of a base portion extending from the casing main body, and a tubular pipe coupling portion extending from the distal end of the base portion. The fluid flow pipes are inserted into the pipe coupling portions of the casing, and are brazed thereto. The casing of the liquid-cooled-type cooling apparatus is composed of an upper structural member and a lower structural member. The upper structural member forms the top wall of the casing main body, an upper half portion of the circumferential wall of the casing main body, upper half portions of the base portions of the fluid passage sections, and upper half portions of the pipe coupling portions of the fluid passage sections. The lower structural member forms the bottom wall of the casing main body, a lower half portion of the circumferential wall of the casing main body, lower half portions of the base portions of the fluid passage sections, and lower half portions of the pipe coupling portions of the fluid passage sections.

The above-mentioned upper structural member includes a top wall forming portion that forms the top wall of the casing main body; a circumferential wall forming portion that forms the upper half portion of the circumferential wall of the casing main body; base portion forming portions that form the upper half portions of the base portions of the fluid passage sections; semi-tubular coupling portion forming portions that form the upper half portions of the pipe coupling portions of the fluid passage sections; and outward extending portions formed along the lower ends of the circumferential wall forming portion, the base portion forming portions, and the coupling portion forming portions. Similarly, the above-mentioned lower structural member includes a bottom wall forming portion that forms the bottom wall of the casing main body; a circumferential wall forming portion that forms the lower half portion of the circumferential wall of the casing main body; base portion forming portions that form the lower half portions of the base portions of the fluid passage sections; semi-tubular coupling portion forming portions that form the lower half portions of the pipe coupling portions of the fluid passage sections; and outward extending portions formed along the upper ends of the circumferential wall forming portion, the base portion forming portions, and the coupling portion forming portions. The outward extending portions of the upper structural member and those of the lower structural member are joined together, whereby the casing is formed. Simultaneously with mutual brazing of the outward extending portions of the two structural members, the inflow pipe and the outflow pipe are brazed to the corresponding pipe coupling portions in a state in which the pipes are inserted into the corresponding pipe coupling portions formed by the coupling portion forming portions of the two structural members. Notably, portions of the outward extending portions of each of the two structural members, which portions are present on the opposite sides of the coupling portion forming portions are horizontal flat portions which are located on a common horizontal plane.

In general, the above-mentioned upper and lower structural members are manufactured by means of performing press work on a metal blank plate by use of two dies having shapes corresponding to the final shape of the lower structural member. However, in this case, the following problems may occur. That is, when the upper and lower structural members are manufactured in accordance with the above-described method, as shown in FIG. 20, round portions (67) (68) are unavoidably formed at the boundaries between the inner circumferential surface of each coupling portion forming portion (63) (64) of each of upper and lower structural members (61) (62) and surfaces of the corresponding horizontal flat portions (65) (66) formed along the opposite side edges of the coupling portion forming portion (63) (64), the surfaces facing the opposite structural member (62) (61). Accordingly, when the two structural members (61) (62) are joined together, relatively large clearances (72) are formed between the inner circumferential surface of a cylindrical tubular pipe coupling portion (69)—which is formed by the coupling portion forming portions (63) (64) and the flat portions (65) (66) of the two structural members (61) (62))—and the outer circumferential surface of a fluid flow pipe (71). Therefore, the clearances (72) are not filled with a brazing material, and a manufactured liquid-cooled-type cooling apparatus may have leakage of cooling-liquid from the casing. Patent Document 1: Japanese Patent Application Laid-Open (kokai) No. 2005-274120

DISCLOSURE OF THE INVENTION

Problem to be Solved by the Invention

An object of the present invention is to solve the above-mentioned problem and to provide a method of manufacturing a pipe coupling component, a method of manufacturing a casing structural member, and a structure for coupling a pipe to a hollow component, which can prevent leakage of fluid.
Means for Solving the Problem To achieve the above object, the present invention comprises the following modes.

1) A method of manufacturing a pipe coupling component including a semi-tubular portion which is to come into close contact with a half of an outer circumferential surface of a pipe, and flat portions which are integrally formed along opposite side edges of the semi-tubular portion and are located on a common plane, wherein edge portions are formed at boundaries between an inner circumferential surface of the semi-tubular portion and surfaces of the flat portions, the surfaces facing a direction toward which the semi-tubular portion is open, the method comprising:

a first step of producing a first intermediate product by performing press work on a metal blank plate through use of two dies each having a shape corresponding to a final shape of a metal component, the first intermediate product including a semi-tubular portion, and flat portions which are integrally formed along opposite side edges of the semi-tubular portion and are located on a common plane, wherein round portions are formed at boundaries between an inner circumferential surface of the semi-tubular portion and surfaces of the flat portions, the surfaces facing a direction toward which the semi-tubular portion is open;

a second step of deforming the flat portions of the first intermediate product so that the flat portions move toward the direction toward which the semi-tubular portion is open, to thereby produce a second intermediate product which is larger in bending depth of the semi-tubular portion and smaller in width of the flat portions than the first intermediate product;

a third step of bending portions of the flat portions of the second intermediate product located on the side toward the semi-tubular portion so that the bent portions form acute angles in relation to opposite side walls of the semi-tubular portion and form obtuse angles in relation to outer portions of the flat portions, to thereby produce a third intermediate product which includes a semi-tubular portion, sloping flat portions extending from the opposite side walls of the semi-tubular portion, and narrow flat portions extending from distal edges of the sloping flat portions, being located on a common plane, and being narrower than the flat portions of the second intermediate product;

a fourth step of pushing the sloping flat portions of the third intermediate product, in a direction away from a bottom portion of the semi-tubular portion, toward the side walls of the semi-tubular portion, while restraining distal edge portions of the narrow flat portions, so as to move the material of the intermediate product to boundaries between the sloping flat portions and the side walls of the semi-tubular portion, to thereby produce a fourth intermediate product;

a fifth step of pressing, from upper and lower sides, opening-side portions of the side walls of the semi-tubular portion, the sloping flat portions, and the narrow flat portions of the fourth intermediate product, to thereby produce a fifth intermediate product which includes a semi-tubular portion having the same depth as the metal component of the final shape, and flat portions extending from opposite side walls of the semi-tubular portions and being identical in shape and dimension with the meal component of the final shape, wherein burrs project toward the interior of the semi-tubular portion from opening-side end portions of the side walls of the semi-tubular portion; and a sixth step of removing the burrs from the fifth intermediate product, to thereby produce the metal component of the final shape which includes a semi-tubular portion which is to come into close contact with an outer circumferential surface of a pipe, and flat portions which are integrally formed along opposite side edges of the semi-tubular portion and are located on a common plane, wherein edge portions are formed at boundaries between an inner circumferential surface of the semi-tubular portion and surfaces of the flat portions, the surfaces facing a direction toward which the semi-tubular portion is open.

2) A method of manufacturing a pipe coupling component according to par. 1), wherein the direction in which the sloping flat portions are pushed in the fourth step inclines 5 to 20 degrees in relation to the plane on which the narrow flat portions are located.

3) A method of manufacturing upper and lower structural members used in a casing comprising a casing main body which is composed of a top wall, a bottom wall, and a circumferential wall and through which fluid flows; and a fluid passage section provided on the casing main body and composed of a base portion communicating with the interior of the casing main body, and a tubular pipe coupling portion extending from a distal end of the base portion, wherein the upper structural member forms the top wall of the casing main body, an upper half portion of the circumferential wall of the casing main body, an upper half portion of the base portion of the fluid passage section, and an upper half portion of the pipe coupling portion of the fluid passage section; and the lower structural member forms the bottom wall of the casing main body, a lower half portion of the circumferential wall of the casing main body, a lower half portion of the base portion of the fluid passage section, and a lower half portion of the pipe coupling portion of the fluid passage section, the method comprising:

a first step of producing a first intermediate product for the upper structural member by performing press work on a metal blank plate through use of two dies each having a shape corresponding to a final shape of the upper structural member, the first intermediate product including a top wall forming portion that forms the top wall of the casing main body, a circumferential wall forming portion that forms the upper half portion of the circumferential wall of the casing main body, a base portion forming portion that forms the upper half portion of the base portion of the fluid passage section, a semi-tubular coupling portion forming portion that forms the upper half portion of the pipe coupling portion of the fluid passage section, and flat portions integrally formed along opposite side edges of the coupling portion forming portion and being located on a common plane, wherein round portions are formed at boundaries between an inner circumferential surface of the coupling portion forming portion and surfaces of the flat portions facing a direction toward which the coupling portion forming portion is open;

a second step of producing a first intermediate product for the lower structural member by performing press work on a metal blank plate through use of two dies each having a shape corresponding to a final shape of the lower structural member, the first intermediate product including a bottom wall forming portion that forms the bottom wall of the casing main body, a circumferential wall forming portion that forms the lower half portion of the circumferential wall of the casing main body, a base portion forming portion that forms the lower half portion of the base portion of the fluid passage section, a semi-tubular coupling portion forming portion that forms the lower half portion of the pipe coupling portion of the fluid passage section, and flat portions integrally formed along opposite side edges of the coupling portion forming portion and being located on a common plane, wherein round portions are formed at boundaries between an inner circumferential surface of the coupling portion forming portion and surfaces of the flat portions facing a direction toward which the coupling portion forming portion is open;

a second step of deforming the flat portions of each first intermediate product so that the flat portions move toward the direction toward which the coupling portion forming portion is open, to thereby produce a second intermediate product for each of the upper and lower structural members, which product is larger in bending depth of the coupling portion forming portion and smaller in width of the flat portions than the first intermediate product;

a third step of bending portions of the flat portions of each second intermediate product located on the side toward the coupling portion forming portion so that the bent portions form acute angles in relation to opposite side walls of the coupling portion forming portion and form obtuse angles in relation to outer portions of the flat portions, to thereby produce a third intermediate product for each of the upper and lower structural members, which product includes a coupling portion forming portion, sloping flat portions extending from the opposite side walls of the coupling portion forming portion, and narrow flat portions extending from distal edges of the sloping flat portions, being located on a common plane, and being narrower than the flat portions of the second intermediate product;

a fourth step of pushing the sloping flat portions of each third intermediate product, in a direction away from a bottom portion of the coupling portion forming portion, toward the side walls of the coupling portion forming portion, while restraining distal edge portions of the narrow flat portions, so as to move the material of the intermediate product to boundaries between the sloping flat portions and the side walls of the coupling portion forming portion, to thereby produce a fourth intermediate product for each of the upper and lower structural members;

a fifth step of pressing, from upper and lower sides, opening-side portions of the side walls of the coupling portion forming portion, the sloping flat portions, and the narrow flat portions of each fourth intermediate product, to thereby produce a fifth intermediate product for each of the upper and lower structural members which product includes a coupling portion forming portion having the same depth as the upper and lower structural members of the final shape, and flat portions extending from the opposite side walls of the coupling portion forming portion and being identical in shape and dimension with the upper and lower structural members of the final shape, wherein burrs project toward the interior of the coupling portion forming portion from opening-side end portions of the side walls of the coupling portion forming portion; and a sixth step of removing the burrs from each fifth intermediate product, to thereby produce the upper and lower structural members of the final shape each of which includes a coupling portion forming portion which is to come into close contact with an outer circumferential surface of a pipe, and flat portions which are integrally formed along opposite side edges of the coupling portion forming portion and are located on a common plane, wherein edge portions are formed at boundaries between an inner circumferential surface of the coupling portion forming portion and surfaces of the flat portions, the surfaces facing a direction toward which the coupling portion forming portion is open.

4) A method of manufacturing casing structural members according to par. 3), wherein the direction in which the sloping flat portions are pushed in the fourth step inclines 5 to 20 degrees in relation to the plane on which the narrow flat portions are located.

5) A structure for coupling a pipe to a tubular pipe coupling portion provided on a hollow component, wherein the pipe coupling portion of the hollow component is composed of two semi-tubular coupling portion forming portions; outward extending flat portions located on a common plane are integrally formed along opposite side edges of each coupling portion forming portion; the flat portions of the two coupling portion forming portions are brazed together; a first outward extending flange is provided at a distal end portion of the pipe coupling portion to surround the two coupling portion forming portions; an outer circumferential edge of the first outward extending flange is located outward of boundaries between an inner circumferential surface of each coupling portion forming portion and surfaces of the corresponding flat portions facing a direction toward which the coupling portion forming portion is open; the pipe includes a to-be-inserted portion which is inserted into the pipe coupling portion, and a second outward extending flange provided on the outer side of the to-be-inserted portion; a coupling auxiliary member is disposed between the first outward extending flange on the hollow component side and the second outward extending flange of the pipe, and is brazed to the two outward extending flanges; and the coupling auxiliary member covers at least portions of end surfaces of the flat portions formed on the coupling portion forming portions of the pipe coupling portion, the end surfaces being located on the side toward the first outward extending flange.

6) A structure for coupling a pipe to a tubular pipe coupling portion provided on a hollow component, wherein the pipe coupling portion of the hollow component is composed of two semi-tubular coupling portion forming portions; outward extending flat portions located on a common plane are integrally formed along opposite side edges of each coupling portion forming portion; the flat portions of the two coupling portion forming portions are brazed together; a first outward extending flange is provided at a distal end portion of the pipe coupling portion to surround the two coupling portion forming portions; an outer circumferential edge of the first outward extending flange is located outward of boundaries between an inner circumferential surface of each coupling portion forming portion and surfaces of the corresponding flat portions facing a direction toward which the coupling portion forming portion is open; the pipe includes a to-be-inserted portion which is inserted into the pipe coupling portion, and a second outward extending flange provided on the outer side of the to-be-inserted portion; the first outward extending flange and the second outward extending flange are brazed together; and an outer circumferential edge of a brazing region where the first and second outward extending flanges are brazed together is located outward of boundaries between an inner circumferential surface of each coupling portion forming portion and surfaces of the corresponding flat portions facing a direction toward which the coupling portion forming portion is open.

7) A structure for coupling a pipe to a hollow component according to par. 6), wherein the first outward extending flange on the hollow component side is provided by means of being formed separately from the pipe coupling portion of the hollow component, fitted onto an end portion of the pipe coupling portion, and brazed to the pipe coupling portion; the first outward extending flange has inward projecting portions which are integrally formed along an inner circumferential edge of the first outward extending flange and which are fitted into cutouts extending over the two coupling portion forming portions of the pipe coupling portion; end portions, located on the side toward first outward extending flange, of the flat portions formed along the opposite side edges of each coupling portion forming portion of the pipe coupling portion are cut so as not to interfere with the first outward extending flange; and an outer surface of the first outward extending flange is flush with an end surface of the pipe coupling portion.

8) A structure for coupling a pipe to a hollow component according to par. 5) or 6), wherein the first outward extending flange on the hollow component side is provided by means of being formed separately from the pipe coupling portion of the hollow component, fitted onto an end portion of the pipe coupling portion, and brazed to the pipe coupling portion; the first outward extending flange has cutouts which are formed along an inner circumferential edge of the first outward extending flange and which receive the flat portions formed along the opposite side edges of each coupling portion forming portion of the pipe coupling portion; and an outer surface of the first outward extending flange is flush with an end surface of the pipe coupling portion and those of the flat portions.

9) A structure for coupling a pipe to a hollow component according to par. 8), wherein the flat portions formed along the opposite side edges of each coupling portion forming portion of the pipe coupling portion have receiving portions which are formed end portions thereof located on the side toward the first outward extending flange so as to receive a portion of the first outward extending flange located radially outward of the cutouts.

10) A structure for coupling a pipe to a hollow component according to par. 5) or 6), wherein the hollow component is a casing comprising a casing main body which is composed of a top wall, a bottom wall, and a circumferential wall and through which fluid flows, and a fluid passage section integrally formed on the casing main body and composed of a base portion communicating with the interior of the casing main body, and a tubular pipe coupling portion extending from a distal end of the base portion; and the casing is composed of an upper structural member and a lower structural member brazed to the upper structural member, the upper structural member forming the top wall of the casing main body, an upper half portion of the circumferential wall of the casing main body, an upper half portion of the base portion of the fluid passage section, and an upper half portion of the pipe coupling portion of the fluid passage section, and the lower structural member forming the bottom wall of the casing main body, a lower half portion of the circumferential wall of the casing main body, a lower half portion of the base portion of the fluid passage section, and a lower half portion of the pipe coupling portion of the fluid passage section; the upper structural member includes a top wall forming portion that forms the top wall of the casing main body, a circumferential wall forming portion that forms the upper half portion of the circumferential wall of the casing main body, a base portion forming portion that forms the upper half portion of the base portion of the fluid passage section, a semi-tubular coupling portion forming portion that forms the upper half portion of the pipe coupling portion of the fluid passage section, and flat portions integrally formed along opposite side edges of the coupling portion forming portion and being located on a common plane; and the lower structural member includes a bottom wall forming portion that forms the bottom wall of the casing main body, a circumferential wall forming portion that forms the lower half portion of the circumferential wall of the casing main body, a base portion forming portion that forms the lower half portion of the base portion of the fluid passage section, a semi-tubular coupling portion forming portion that forms the lower half portion of the pipe coupling portion of the fluid passage section, and flat portions integrally formed along opposite side edges of the coupling portion forming portion and being located on a common plane.

Effects of the Invention

According to the method of par. 1), there can be manufactured a pipe coupling component including a semi-tubular portion which is to come into close contact with a half of the outer circumferential surface of a pipe, and flat portions which are integrally formed along opposite side edges of the semi-tubular portion and are located on a common plane, in which edge portions are formed, rather than round portions, at the boundaries between the inner circumferential surface of the semi-tubular portion and the surfaces of the flat portions facing the direction toward which the semi-tubular portion is open. Accordingly, when two pipe coupling components manufactured by this method are combined such that the openings of their semi-tubular portions face each other, it is possible to prevent formation of a relatively large clearance between the inner circumferential surface of a tubular portion formed by the two semi-tubular portions and the outer circumferential surface of the pipe inserted into the tubular portion. As a result, it is possible to prevent leakage of fluid from a product formed from the two pipe coupling components.

According to the method of par. 2), the size of the burrs of the fifth intermediate product produced in the fifth step of the above-described method of par. 1) can be set to such a size that, through removal of the burrs in the sixth step of the method, edge portions can be formed, without fail, at the boundaries between the inner circumferential surface of the semi-tubular portion and the surfaces of the flat portions facing the direction toward which the semi-tubular portion is open, and that the amount of the material to be removed can be minimized.

According to the method of par. 3), there can be produced an upper structural member including a top wall forming portion that forms the top wall of the casing main body, a circumferential wall forming portion that forms the upper half portion of the circumferential wall of the casing main body, a base portion forming portion that forms the upper half portion of the base portion of the fluid passage section, a semi-tubular coupling portion forming portion that forms the upper half portion of the pipe coupling portion of the fluid passage section, and flat portions integrally formed along opposite side edges of the coupling portion forming portion and being located on a common plane, in which edge portions are formed, rather than round portions, at the boundaries between the inner circumferential surface of the coupling portion forming portion and surfaces of the flat portions facing the direction toward which the coupling portion forming portion is open. Further, there can be produced a lower structural member including a bottom wall forming portion that forms the bottom wall of the casing main body, a circumferential wall forming portion that forms the lower half portion of the circumferential wall of the casing main body, a base portion forming portion that forms the lower half portion of the base portion of the fluid passage section, a semi-tubular coupling portion forming portion that forms the lower half portion of the pipe coupling portion of the fluid passage section, and flat portions integrally formed along opposite side edges of the coupling portion forming portion and being located on a common plane, in which edge portions are formed, rather than round portions, at the boundaries between the inner circumferential surface of the coupling portion forming portion and surfaces of the flat portions facing the direction toward which the coupling portion forming portion is open. Accordingly, when the upper and lower structural components manufactured by this method are combined such that the openings of their coupling portion forming portions face each other, it is possible to prevent formation of a relatively large clearance between the inner circumferential surface of the pipe coupling portion formed by the two coupling portion forming portions and the outer circumferential surface of the pipe inserted into the pipe coupling portion. As a result, it is possible to prevent leakage of fluid from a casing formed from the upper and lower structural members.

According to the method of par. 4), the size of the burrs of the fifth intermediate product produced in the fifth step of the above-described method of par. 3) can be set to such a size that, through removal of the burrs in the sixth step of the method, edge portions can be formed, without fail, at the boundaries between the inner circumferential surface of the coupling portion forming portion and the surfaces of the flat portions facing the direction toward which the coupling portion forming portions is open, and that the amount of the material to be removed can be minimized.

According to the pipe coupling structure of par. 5), a first outward extending flange is provided at a distal end portion of the pipe coupling portion to surround the two coupling portion forming portions; the outer circumferential edge of the first outward extending flange is located outward of the boundaries between the inner circumferential surface of each coupling portion forming portion and the surfaces of the corresponding flat portions facing a direction toward which the coupling portion forming portion is open; the pipe includes a to-be-inserted portion which is inserted into the pipe coupling portion, and a second outward extending flange provided on the outer side of the to-be-inserted portion; a coupling auxiliary member is disposed between the first outward extending flange on the hollow component side and the second outward extending flange of the pipe, and is brazed to the two outward extending flanges; and the coupling auxiliary member covers at least portions of end surfaces of the flat portions formed on the coupling portion forming portions of the pipe coupling portion, the end surfaces being located on the side toward the first outward extending flange. Therefore, even in the case where round portions are formed at the boundaries between the inner circumferential surface of each coupling portion forming portion and the surfaces of the corresponding flat portions facing the direction toward which the coupling portion forming portion is open, and, as a result, a relatively large clearance is formed between the inner circumferential surface of the tubular pipe coupling portion formed by the coupling portion forming portions and the outer circumferential surface of the pipe inserted into the pipe coupling portion, the coupling auxiliary member closes the open end of the clearance located on the side toward the first outward extending flange. Accordingly, leakage of fluid from the hollow component can be prevented.

According to the pipe coupling structure of par. 6), a first outward extending flange is provided at a distal end portion of the pipe coupling portion to surround the two coupling portion forming portions; the outer circumferential edge of the first outward extending flange is located outward of the boundaries between the inner circumferential surface of each coupling portion forming portion and the surfaces of the corresponding flat portions facing the direction toward which the coupling portion forming portion is open; the pipe includes a to-be-inserted portion which is inserted into the pipe coupling portion, and a second outward extending flange provided on the outer side of the to-be-inserted portion; the first outward extending flange and the second outward extending flange are brazed together; and the outer circumferential edge of the brazing region where the first and second outward extending flanges are brazed together is located outward of the boundaries between the inner circumferential surface of each coupling portion forming portion and the surfaces of the corresponding flat portions facing the direction toward which the coupling portion forming portion is open. Therefore, even in the case where round portions are formed at the boundaries between the inner circumferential surface of each coupling portion forming portion and the surfaces of the corresponding flat portions facing the direction toward which the coupling portion forming portion is open, and, as a result, a relatively large clearance is formed between the inner circumferential surface of the tubular pipe coupling portion formed by the coupling portion forming portions and the outer circumferential surface of the pipe inserted into the pipe coupling portion, the second outward extending flange closes the open end of the clearance located on the side toward the first outward extending flange. Accordingly, leakage of fluid from the hollow component can be prevented.

According to the pipe coupling structure of par. 7), the first outward extending flange on the hollow component side is provided by means of being formed separately from the pipe coupling portion of the hollow component, fitted onto an end portion of the pipe coupling portion, and brazed to the pipe coupling portion; the first outward extending flange has inward projecting portions which are integrally formed along the inner circumferential edge of the first outward extending flange and which are fitted into cutouts extending over the two coupling portion forming portions of the pipe coupling portion; the end portions, located on the side toward first outward extending flange, of the flat portions formed along the opposite side edges of each coupling portion forming portion of the pipe coupling portion are cut so as not to interfere with the first outward extending flange; and the outer surface of the first outward extending flange is flush with the end surface of the pipe coupling portion. Accordingly, leakage of fluid from the hollow component can be prevented effectively. In addition, positioning of the first outward extending flange in relation to the pipe coupling portion and the flat portions can be performed accurately.

According to the pipe coupling structure of par. 8), the first outward extending flange on the hollow component side is provided by means of being formed separately from the pipe coupling portion of the hollow component, fitted onto an end portion of the pipe coupling portion, and brazed to the pipe coupling portion; the first outward extending flange has cutouts which are formed along the inner circumferential edge of the first outward extending flange and which receive the flat portions formed along the opposite side edges of each coupling portion forming portion of the pipe coupling portion; and the outer surface of the first outward extending flange is flush with the end surface of the pipe coupling portion and those of the flat portions. Accordingly, leakage of fluid from the hollow component can be prevented effectively.

According to the pipe coupling structure of par. 9), in the pipe coupling structure of par. 8), positioning of the first outward extending flange in relation to the pipe coupling portion and the flat portions can be performed accurately.

According to the pipe coupling structure of par. 10), even in the case where, a relatively large clearance is formed between the inner circumferential surface of the pipe coupling portion—which is formed by the two coupling portion forming portions when the upper and lower structural members are joined—and the outer circumferential surface of the pipe inserted into the pipe coupling portion, leakage of fluid from a casing formed from the upper and lower structural members can be prevented.

BEST MODE FOR CARRYING OUT THE INVENTION

Embodiments of the present invention will next be described with reference to the drawings.

Throughout the drawings, like portions and like members are denoted by like reference numerals, and repeated descriptions are omitted.

In the following description, the term "aluminum" encompasses aluminum alloys in addition to pure aluminum.

Embodiment 1

FIGS. 1 to 6 show the present embodiment in which the method of manufacturing a casing structural member according to the present invention is applied to manufacture of casing structural members of a liquid-cooled-type cooling apparatus.

FIGS. 1 to 4 show a liquid-cooled-type cooling apparatus which includes a casing composed of structural members manufactured by the method of the present invention. FIGS. 5 and 6 show a method of manufacturing the structural members of the casing.

Notably, in the description of the liquid-cooled-type cooling apparatus based on FIGS. 1 to 4, the lower side of FIG. 2 will be referred to as the front, and the upper side of FIG. 2 will be referred to as the rear; and the upper, lower, left-hand, and right-hand sides of FIG. 3 will be referred to as "upper," "lower," "left," and "right," respectively.

In FIGS. 1 to 3, a liquid-cooled-type cooling apparatus (1) comprises a hollow casing (2); an inflow pipe (3) formed of a round pipe and connected to the casing (2) so as to allow cooling-liquid to flow into the casing (2); and an outflow pipe (4) formed of a round pipe and connected to the casing (2) so as to allow the cooling-liquid to flow out of the casing (2).

The casing (2) includes a casing main body (5) in the form of a flat rectangular parallelepiped, and cooling-liquid inflow and outflow sections (9) (11) (fluid passage sections) formed integrally with the casing main body (5). The casing main body (5) is composed of a top wall (6), a bottom wall (7), and a circumferential wall (8), and the cooling-liquid flows through the interior of the casing main body (5). The cooling-liquid inflow section (9) projects rightward from a rear end portion of the right side edge of the casing main body (5), and communicates with the interior of the casing main body (5). The cooling-liquid outflow section (11) projects rightward from a front end portion of the right side edge of the casing main body (5), and communicates with the interior of the casing main body (5).

The circumferential wall (8) of the casing main body (5) includes a vertical front side wall portion (8*a*) extending in a left-right direction; a vertical rear side wall portion (8*b*) extending in the left-right direction and facing the front side wall portion (8*a*); a vertical left side wall portion (8*c*) extending in a front-rear direction and connecting together left end portions of the front side wall portion (8*a*) and the rear side wall portion (8*b*); and a vertical right side wall portion (8*d*) extending in the front-rear direction and facing the left side wall portion (8*c*). The cooling-liquid inflow section (9) includes a rectangular tubular base portion (12), and a cylindrical tubular pipe coupling portion (13). The base portion (12) extends from the casing main body (5), and has the same height as the casing main body (5). The pipe coupling portion (13) extends from a right end portion of the base portion (12), and has an outer diameter equal to the width of the base portion (12) as measured in the front-rear direction. The upper surface of the base portion (12) of the cooling-liquid inflow section (9) is flush with the upper surface of the top wall (6) of the casing main body (5), the lower surface of the base portion (12) is flush with the lower surface of the bottom wall (7), and the rear surface of the base portion (12) is flush with the rear surface of the rear side wall portion (8*b*) of the circumferential wall (8). Further, the front surface of the base portion (12) is perpendicular to the right surface of the right side wall portion (8*d*) of the circumferential wall (8). The cooling-liquid outflow section (11) includes a rectangular tubular base portion (14), and a cylindrical tubular pipe coupling portion (15). The base portion (14) extends from the casing main body (5), and has the same height as the casing main body (5). The pipe coupling portion (15) extends from a right end portion of the base portion (14), and has an outer diameter equal to the width of the base portion (14) as measured in the front-rear direction. The upper surface of the base portion (14) of the cooling-liquid outflow section (11) is flush with the upper surface of the top wall (6) of the casing main body (5), the lower surface of the base portion (14) is flush with the lower surface of the bottom wall (7), and the front surface of the base portion (14) is flush with the front-surface of the front side wall portion (8*a*) of the circumferential wall (8). Further, the rear surface of the base portion (12) is perpendicular to the right surface of the right side wall portion (8*d*) of the circumferential wall (8).

The casing (2) composed of the casing main body (5), the cooling-liquid inflow section (9), and the cooling-liquid outflow section (11) is formed by an upper structural member (16) (a casing structural member), which is formed of aluminum, and a lower structural member (17) (a casing structural member), which is formed of aluminum and is symmetric with the upper structural member (16) with respect to the vertical direction. The upper structural member (16) includes a top wall forming portion (16*a*) that forms the top wall (6) of the casing main body (5), a circumferential wall forming portion (16*b*) that forms an upper half portion of the circumferential wall (8) of the casing main body (5), base portion forming portions (16*c*) that form upper half portions of the base portions (12) (14) of the cooling-liquid inflow section (9) and the cooling-liquid outflow section (11), and coupling portion forming portions (16*d*) (semi-tubular portions) that form upper half portions of the pipe coupling portions (13) (15) of the cooling-liquid inflow section (9) and the cooling-liquid outflow section (11). The lower structural member (17) includes a bottom wall forming portion (17*a*) that forms the bottom wall (7) of the casing main body (5), a circumferential wall forming portion (17*b*) that forms a lower half portion of the circumferential wall (8) of the casing main body (5), base portion forming portions (17*c*) that form lower half portions of the base portions (12) (14) of the cooling-liquid inflow section (9) and the cooling-liquid outflow section (11), and coupling portion forming portions (17*d*) (semi-tubular portions) that form lower half portions of the pipe coupling portions (13) (15) of the cooling-liquid inflow section (9) and the cooling-liquid outflow section (11). The base portion forming portions (16*c*) (17*c*) of each of the upper and lower structural members (16) (17) assume a semi-rectangular tubular shape so that they are open toward the opposite structural member (17) (16). The coupling portion forming portions (16*d*) (17*d*) of each of the upper and lower structural members (16) (17) assume a semi-cylindrical tubular shape so that they are open toward the opposite structural member (17) (16).

Horizontal, flat outward extending portions (18) are integrally formed at the lower end of the upper structural member (16); that is, from the lower end of the circumferential wall forming portion (16*b*) to the lower ends of the base portion forming portions (16*c*) and the coupling portion forming portions (16*d*). Furthermore, horizontal, flat outward extending portions (19) are integrally formed at the upper end of the lower structural member (17); that is, from the upper end of the circumferential wall forming portion (17*b*) to the upper ends of the base portion forming portions (17*c*) and the coupling portion forming portion (17*d*). The outward extending portions (18) (19) of the two structural members (16) (17) are brazed together, whereby the casing (2) is formed. Portions of the outward extending portions (18) of the upper structural member (16), which portions extend along the front and rear side edges of the coupling portion forming portions (16d), serve as horizontal flat portions (21) that are integrally formed along the opposite side edges of the coupling portion forming portions (16d) and are located on a common plane. Also, portions of the outward extending portions (19) of the lower structural member (17), which portions extend along the front and rear side edges of the coupling portion forming portions (17d), serve as horizontal flat portions (22) that are integrally formed along the opposite side edges of the coupling portion forming portions (17d) and are located on a common plane. As shown in FIG. 4, edge portions (20) are formed at the boundaries between the inner circumferential surface of each coupling portion forming portion (16d) of the upper structural member (16) and the lower surfaces of the flat portions (21) of the upper structural member (16) (surfaces of the flat portions (21) which face the direction toward which the coupling portion forming portion (16d) is open). Similarly, edge portions (20) are formed at the boundaries between the inner circumferential surface of each coupling portion forming portion (17d) of the lower structural member (17) and the upper surfaces of the flat portions (22) of the lower structural member (17) (surfaces of the flat portions (22) which face the direction toward which the coupling portion forming portion (17d) is open). Accordingly, it is possible to prevent formation of relatively large clearances between the inflow pipe (3) and the outflow pipe (4) and the inner circumferential surfaces of the pipe coupling portions (13) (15) formed by the coupling portion forming portions (16d) (17d) of the upper and lower structural members (16) (17). As a result, it is possible to prevent leakage of cooling-liquid from the casing (2) formed by the upper and lower structural members (16) (17).

A corrugated fin (23) formed of aluminum is disposed in an internal region of the casing main body (5) located between the left side wall portion (8c) and the right side wall portion (8d) and between the cooling-liquid inflow section (9) and the cooling-liquid outflow section (11). The corrugated fin (23) includes wave crest portions, wave trough portions, and vertical connection portions connecting the wave crest portions and the wave trough portions. The wave crest portions are brazed to the top wall (6) of the casing main body (5), whereas the wave trough portions are brazed to the bottom wall (7) of the casing main body (5). The corrugated fin (23) forms a plurality of flow channels (24) which extend in the front-rear direction and are arranged in the left-right direction and through which cooling liquid flows in the front-rear direction, thereby providing a parallel-flow-channel section (25) including a plurality of flow channels (24). A portion of the interior of the casing main body (5) located upstream (rearward) of the parallel-flow-channel section (25) serves as an inlet header section (26) communicating with the cooling-liquid inflow section (9). A portion of the interior of the casing main body (5) located downstream (frontward) of the parallel-flow-channel section (25) serves as an outlet header section (27) communicating with the cooling-liquid outflow section (11).

In the liquid-cooled-type cooling apparatus (1) having the above-described structure, a semiconductor device (P), which is a heat-generating body, is joined to the outer surface of the top wall (6) of the casing main body (5) via a plate-shaped insulating member (I). The cooling-liquid fed from unillustrated cooling-liquid supply piping into the inflow pipe (3) flows into the inlet header section (26) of the casing main body (5) via the cooling-liquid inflow section (9). The cooling liquid having flowed into the inlet header section (26) flows into all of the flow channels (24) of the parallel-flow-channel section (25) in a divided manner, and flows frontward through the flow channels (24).

The cooling-liquid having flowed frontward within the flow channels (24) of the parallel-flow-channel section (25) enters the outlet header section (27), flows rightward within the outlet header section (27), and flows into the outflow pipe (4) via the cooling-liquid outflow section (11). The cooling-liquid having flowed into the outflow pipe (4) is fed to unillustrated cooling-liquid discharge piping.

Heat generated from the semiconductor device (P) is transmitted to the cooling liquid which flows through the flow channels (24), via the insulating member (I), the top wall (6) of the casing main body (5), and the corrugated fin (23). The semiconductor device (P) is thus cooled.

In the following, a method of manufacturing the upper and lower structural members (16) (17) of the casing (2) will be described with reference to FIGS. 5 and 6. Notably, in the following description regarding the method of manufacturing the upper and lower structural members (16) (17) of the casing (2), the upper, lower, left-hand, and right-hand sides of FIG. 5 will be referred to as "upper," "lower," "left," and "right," respectively. Further, the upper and lower structural members (16) (17) are symmetric with respect to the vertical direction and have the same shape, and are manufactured by the same method. Therefore, only the method of manufacturing the upper structural member (16) will be described.

First, by use of two dies (not shown) having shapes corresponding to the final shape of the upper structural member (16), press work is performed on a metal blank plate which is formed of an aluminum brazing sheet having a brazing material layer on an upper surface thereof. Thus, there is manufactured a first intermediate product (31) for the upper structural member (16), which includes the top wall forming portion (16a) that forms the top wall (6) of the casing main body (5), the circumferential wall forming portion (16b) that forms the upper half portion of the circumferential wall (8) of the casing main body (5), the base portion forming portions (16c) that form the upper half portions of the base portions (12) (14) of the cooling-liquid inflow section (9) and the cooling-liquid outflow section (11), the semi-cylindrical tubular coupling portion forming portions (16d) that form the upper half portions of the pipe coupling portions (13) (15) of the cooling-liquid inflow section (9) and the cooling-liquid outflow section (11), and the horizontal, flat outward extending portions (18), which are integrally formed to extend from the lower end of the circumferential wall forming portion (16b) to the lower ends of the base portion forming portions (16c) and the coupling portion forming portions (16d) and which are located on a common horizontal plane. In the first intermediate product (31), round portions (32) are formed at the boundaries between the inner circumferential surface of the circumferential wall forming portion (16b), the inner circumferential surface of each base portion forming portion (16c), and the inner circumferential surface of each coupling portion forming portion (16d) and the upper surfaces (surfaces facing the direction toward which the coupling portion forming portion (16d) is open) of the outward extending portions (18) (the horizontal flat portions (21) at the coupling portion forming portion (16d)) (see FIG. 5(a)).

Subsequently, the flat portions (21), which are portions of the outward extending portions (18) of the first intermediate product (31) and which extend along the opposite side edges of each coupling portion forming portion (16d), are deformed to move upward (toward the side to which the coupling portion forming portion (16d) is open), to thereby produce a second intermediate product (33) in which each coupling portion forming portion (16d) has an increased bending depth and each horizontal flat portion (21) has a decreased width as compared with the first intermediate product (31) (see FIG. 5(b)).

Subsequently, portions of the horizontal flat portions (21) of the second intermediate product (33), the portions being located on the inner side with respect to the left-right direction (on the side toward the coupling portion forming portion (16d)), are bent in such a manner that the bent portions form acute angles in relation to the opposite side walls of the coupling portion forming portion (16d), and form obtuse angles in relation to outer portions of the horizontal flat portions (21) with respect to the left-right direction, to thereby form sloping flat portions (34). Thus, there is produced a third intermediate product (36) which includes the coupling portion forming portion (16d), the sloping flat portions (34) extending from the opposite side walls of the coupling portion forming portion (16d), and horizontal, narrow flat portions (35), which extend from distal edges of the opposite sloping flat portions (34), are located on a common plane, and are narrower than the horizontal flat portions (21) of the second intermediate product (33) (see FIG. 5(c)).

Subsequently, in a state in which distal edge portions of the opposite, horizontal, narrow flat portions (35) of the third intermediate product (36) are restrained from the opposite sides with respect to the left-right direction, the opposite sloping flat portions (34) are pushed upward and inward with respect to the left-right direction (in directions away from the bottom portion of the coupling portion forming portion (16d) toward the opposite side walls of the coupling portion forming portion (16d)), whereby the material of the product is forced to move to the boundaries between the sloping flat portions (34) and the side walls of the coupling portion forming portion (16d). Thus, a fourth intermediate product (37) is produced (see FIG. 5(d)). Preferably, the inclination angle a of the directions in which the sloping flat portions (34) are pushed in the step of producing the fourth intermediate product (37) is 5 to 20 degrees in relation to the plane on which the horizontal, narrow flat portions (35) are located.

Subsequently, by means of pressing, from upper and lower sides, upper portions (portions near the opening) of the side walls of the coupling portion forming portion (16d) of the fourth intermediate product (37), the sloping flat portions (34) thereof, and the horizontal, narrow flat portions (35) thereof, there is produced a fifth intermediate product (39), which includes the coupling portion forming portion (16d) having the same depth as the upper structural member (16) of the final shape, and the horizontal flat portions (21) extending from the opposite side walls of the coupling portion forming portion (16d) and having the same shape and dimension as those of the upper structural member (16) of the final shape, and in which burrs (38) projecting toward the interior of the coupling portion forming portion (16d) are formed on the upper ends of the opposite side walls of the coupling portion forming portion (16d) (see FIGS. 5(e) and 6). The burrs (38) are formed by the material having flowed from the sloping flat portions (34) and the horizontal, narrow flat portions (35).

After that, by means of removing the burrs (38) from the fifth intermediate product (39), there is completed the upper structural member (16), which includes the coupling portion forming portions (16d) to come into close contact with halves of the outer circumferential surfaces of the inflow pipe (3) and the outflow pipe (4), and the horizontal flat portions (21) integrally formed along the opposite side edges of each coupling portion forming portion (16d) and being located on a common plane. In the completed upper structural member (16), the edge portions (20) are formed at the boundaries between the inner circumferential surface of each coupling portion forming portion (16d) and the surfaces of the flat portions (21) facing the direction toward which the coupling portion forming portion (16d) is open (see FIG. 5(f)).

In the above-described embodiment, a method of manufacturing the upper and lower structural members (16) (17) of the casing (2) of the liquid-cooled-type cooling apparatus (1) has been described. However, the method according to the present invention can be applied to manufacture of a pipe coupling component which has a semi-tubular portion to come into close contact with a half of the outer circumferential surface of a pipe, and flat portions integrally formed along opposite side edges of the semi-tubular portion and being located on a common plane, and in which edge portions are formed at the boundaries between the inner circumferential surface of the semi-tubular portion and the surfaces of the flat portions facing a direction toward which the semi-tubular portion is open.

Embodiment 2

FIGS. 7 to 13 show this embodiment in which the structure for coupling a pipe to a hollow component according to the present invention is applied to coupling of inflow and outflow pipes to pipe coupling portions of a casing of a liquid-cooled-type cooling apparatus.

FIGS. 7 to 11 show a liquid-cooled-type cooling apparatus having a casing to which pipes are connected by use of the pipe coupling structure of the present invention. FIGS. 12 to 13 show a method of coupling the pipes to the casing.

Notably, in the description, the lower side of FIG. 8 will be referred to as the front, and the upper side of FIG. 8 will be referred to as the rear; and the upper, lower, left-hand, and right-hand sides of FIG. 9 will be referred to as "upper," "lower," "left," and "right," respectively.

In FIGS. 7 to 9, each of the upper and lower structural members (16) (17) of the liquid-cooled-type cooling apparatus (1) is formed through press work performed on an aluminum brazing sheet having a brazing material layer on one side thereof, so that the brazing material layer faces inward. Since the upper and lower structural members (16) (17) are each formed from an aluminum brazing sheet having a brazing material layer on one side thereof, so that the brazing material layer faces inward, the brazing material layer is present on each of the lower surfaces of the outward extending portions (18) of the upper structural member (16) and the upper surfaces of the outward extending portions (19) of the lower structural member (17). Thus, the casing (2) is formed by means of brazing together the outward extending portions (18) (19) of the two structural members (16) (17).

Since each of the upper and lower structural members (16) (17) is formed by means of performing press work on an aluminum brazing sheet, as shown in FIG. 10, round portions (40) are formed at the boundaries between the inner circumferential surface of each coupling portion forming portion (16d) of the upper structural member (16) and the lower surfaces of the flat portions (21) of the upper structural member (16) (surfaces of the flat portions (21) which face the direction toward which the coupling portion forming portion (16d) is open). Similarly, round portions (40) are formed at the boundaries between the inner circumferential surface of each coupling portion forming portion (17d) of the lower structural member (17) and the upper surfaces of the flat portions (22) of, the lower structural member (17) (surfaces of the flat portions (22) which face the direction toward which the coupling portion forming portion (17d) is open). Accordingly, clearances (41) are formed between the inflow pipe (3) and the outflow pipe (4) and the inner circumferential surfaces of the pipe coupling portions (13) (15) formed by the coupling portion forming portions (16d) (17d) of the upper and lower structural members (16) (17).

The structure for coupling the inflow pipe (3) and the outflow pipe (4) to the pipe coupling portions (13) (15) of the casing (2) is as follows. As shown in FIGS. 10 and 11, a first outward extending flange (42) on the casing (2) side is provided at a distal end portion of each pipe coupling portion (13) (15) so that the flange surrounds the coupling portion forming portions (16d) (17d) and the horizontal flat portions (21) (22) of the upper and lower structural members (16) (17). The first outward extending flange (42) is formed from an aluminum brazing sheet having a brazing material layer on each of the opposite sides thereof, separately from the upper and lower structural members (16) (17); that is, the pipe coupling portion (13) (15). The first outward extending flange (42) includes an annular portion (42a), and outward projecting portions (42b) integrally formed at opposite side portions of the annular portion (42a) with respect to the front-rear direction such that the outward projecting portions (42b) project radially outward and are located at diametrically opposite positions. The outer circumferential edge of the annular portion (42a) is located radially outward of the round portions (40) formed at the boundaries between the inner circumferential surface of the coupling portion forming portion (16d) of the upper structural member (16) and the lower surfaces of the flat portions (21) of the upper structural member (16), and is also located radially outward of the round portions (40) formed at the boundaries between the inner circumferential surface of the coupling portion forming portion (17d) of the lower structural member (17) and the upper surfaces of the flat portions (22) of the lower structural member (17). The first outward extending flange (42) has cutouts (43) which extend from the inner circumferential edge of the annular portion (42a) to intermediate portions of the opposite outward projecting portions (42b) with respect to the inside-outside direction, and into which the opposite horizontal flat portions (21) (22) are fitted. Further, receiving portions (21a) (22a) are formed at right end portions (that is, end portions located on the side toward the first outward extending flange (42)) of the horizontal flat portions (21) (22) of the upper and lower structural members (16) (17). The receiving portions (21a) (22a) project outward in the front-rear direction, and receive portions of the outward projecting portions (42b) of the first outward extending flange (42), the portions being located radially outward of the cutouts (43). The first outward extending flange (42) is brazed to the pipe coupling portion (13) (15) and the horizontal flat portions (21) (22) by making use of its own brazing material layer, in a state in which right end portions of the horizontal flat portions (21) (22) are fitted into the cutouts (43), the annular portion (42a) is fitted onto the circumference of the end portion of the pipe coupling portion (13) (15), and the opposite outward projecting portions (42b) are received by the receiving portions (21a) (22a) of the horizontal flat portions (21) (22). The right side surface (outer surface) of the first outward extending flange (42) is flush with the right end surfaces of the pipe coupling portion (13) (15) and the horizontal flat portions (21) (22).

A coupling auxiliary member (44), which is formed from an aluminum brazing sheet having a brazing material layer on each of the opposite sides thereof, is brazed to the right side surface of the first outward extending flange (42). The coupling auxiliary member (44) includes an annular portion (44a), and outward projecting portions (44b) integrally formed at opposite side portions of the annular portion (44a) with respect to the front-rear direction such that the outward projecting portions (44b) project radially outward and are located at diametrically opposite positions. The coupling auxiliary member (44) is identical in shape and size with the first outward extending flange (42), except that the cutouts (43) are not formed. The upper and lower edges of the outward projecting portions (44b) of the coupling auxiliary member (44) are located vertically outward of the upper surfaces of the horizontal flat portions (21) of the upper structural member (16) and the lower surfaces of the horizontal flat portions (22) of the lower structural member (17), respectively. Furthermore, the outer edges of the outward projecting portions (44b) with respect to the front-rear direction are located on the same straight lines with the outer edges of the opposite horizontal flat portions (21) (22) with respect to the front-rear direction. Accordingly, the coupling auxiliary member (44) covers the entire end surfaces (entire right end surfaces), on the site toward the first outward extending flange (42), of portions of the flat portions (21) (22) of the coupling portion forming portions (16d) (17d) of the pipe coupling portion (13) (15) of the refrigerant inflow section (9) (the refrigerant outflow section (11)), the portions being fitted into the cutouts (43). As a result, the coupling auxiliary member (44) completely closes the open ends of the clearances (41) located on the side (right side) toward the first outward extending flange (42), the clearances (41) being formed between the inflow pipe (3) and the outflow pipe (4) and the inner circumferential surfaces of the pipe coupling portions (13) (15) formed by the coupling portion forming portions (16d) (17d) of the upper and lower structural members (16) (17). Accordingly, leakage of fluid from the casing (2) can be prevented. As described above, the clearances (41) are formed as a result of formation of the round portions (40) at the boundaries between the inner circumferential surface of each coupling portion forming portion (16d) and the surfaces of the flat portions (21) facing the direction toward which the coupling portion forming portion (16d) is open and at the boundaries between the inner circumferential surface of each coupling portion forming portion (17d) and the surfaces of the flat portions (22) facing the direction toward which the coupling portion forming portion (17d) is open.

Each of the inflow pipe (3) and the outflow pipe (4) includes a to-be-inserted portion (45) to be inserted into the pipe coupling portion (13) (15) of the casing (2), and a second outward extending flange (46) integrally formed on the outer side (right side) of the to-be-inserted portion (45). The to-be-inserted portion (45) is brazed to the pipe coupling portion (13) (15), and the second outward extending flange (46) is brazed to the coupling auxiliary member (44). The outer circumferential edge of a region where the second outward extending flange (46) and the coupling auxiliary member (44) are brazed together may be located radially outward or radially inward of the round portions (40) formed at the boundaries between the lower surfaces of the flat portions (21) of the upper structural member (16) and the upper surfaces of the flat portions (22) of the lower structural member (17).

Simultaneously with manufacture of the liquid-cooled-type cooling apparatus (1), the inflow pipe (3) and the outflow pipe (4) are connected to the pipe coupling portions. (13) (15) of the casing (2) by a method to be described below. That is, the upper and lower structural members (16) (17), the first outward extending flanges (42), the coupling auxiliary members (44), the inflow pipe (3), and the outflow pipe (4) are prepared; and the upper and lower structural members (16) (17) are assembled together so that the outward extending portions (18) (19) come into close contact with each other (see FIG. 12). At that time, the corrugate fin (23) is disposed between the upper and lower structural members (16) (17). Subsequently, the annular portion (42a) of the first outward extending flange (42) is fitted onto the circumference of the pipe coupling portion (13) (15) so that the horizontal flat portions (21) (22) are fitted into the cutouts (43); and the outward projecting portions (42b) are brought into contact with the receiving portions (21a) (22a) of the horizontal flat portions (21) (22.) (see FIG. 13(a)). Subsequently, after the coupling auxiliary member (44) is placed on the outer surface (the right side surface) of the first outward extending flange (42) (see FIG. 13(b)), the to-be-inserted portion (45) of the cooling-liquid inflow pipe (3) (the cooling-liquid outflow pipe (4)) is passed through the annular portion (44a) of the coupling auxiliary member (44) and the annular portion (42a) of the first outward extending flange (42), and inserted into the pipe coupling portion (13) (15); and the second outward extending flange (46) is brought into contact with the outer surface (right side surface) of the coupling auxiliary member (44) (see FIG. 13(c)). Subsequently, the upper and lower structural members (16) (17), the first outward extending flange (42), and the coupling auxiliary member (44) are provisionally fixed together by use of unillustrated proper means; and the cooling-liquid inflow pipe (3) (the cooling-liquid outflow pipe (4)) is provisionally fixed to the pipe coupling portion (13) (the pipe coupling portion (15)). The provisional fixing of the cooling-liquid inflow pipe (3) (the cooling-liquid outflow pipe (4)) to the pipe coupling portion (13) (the pipe coupling portion (15)) is performed, for example, by use of clips (47) as shown in FIG. 13(d). Specifically, the receiving portions (21a) (22a) of the horizontal flat portions (21) (22) of the pipe coupling portion (13) (the pipe coupling portion (15)) and the second outward extending flange (46) of the cooling-liquid inflow pipe (3) (the cooling-liquid outflow pipe (4)) are held together by the clips (47). Notably, the shape of the clips is not limited to the illustrated shape, and may be changed freely. After that, the upper and lower structural members (16) (17), the first outward extending flanges (42), the coupling auxiliary members (44), the cooling-liquid inflow pipe (3), and the cooling-liquid outflow pipe (4) are heated to a predetermined brazing temperature so as to braze together the outward extending portions (18) (19) of the upper and lower structural members (16) (17), to thereby form the casing (2). Simultaneously with this, brazing is effected between the first outward extending flange (42) and the pipe coupling portion (13) (the pipe coupling portion (15)) and the horizontal flat portions (21) (22), between the first outward extending flange (42) and the coupling auxiliary member (44), between the to-be-inserted portion (45) of the cooling-liquid inflow pipe (3) (the cooling-liquid outflow pipe (4)) and the pipe coupling portion (13) (the pipe coupling portion (15)), and between the coupling auxiliary member (44) and the second outward extending flange (46). Thus, the liquid-cooled-type cooling apparatus (1) is completed.

In the liquid-cooled-type cooling apparatus (1) having the above-described structure, cooling of the semiconductor device (P), which is a heat-generating body, is performed in a manner similar to that in Embodiment 1.

Embodiment 3

FIGS. 14 to 16 show the present embodiment in which the structure for coupling a pipe to a hollow component according to the present invention is applied to connection of inflow and outflow pipes to pipe coupling portions of a casing of a liquid-cooled-type cooling apparatus.

In the case of the structure according to the present embodiment for coupling the inflow pipe (3) and the outflow pipe (4) to the pipe coupling portions (13) (15) of the casing (2), a first outward extending flange (50) is provided at the distal end portion of the pipe coupling portion (13) (15) so that the flange surrounds the coupling portion forming portions (16d) (17d) and the horizontal flat portions (21) (22) of the upper and lower structural members (16) (17). The outer circumferential edge of the annular portion (50a) of the first outward extending flange (50) is located radially outward of the round portions (40) formed at the boundaries between the inner circumferential surface of the coupling portion forming portion (16d) of the upper structural members (16) and the lower surfaces of the flat portions (21) of the upper structural member (16) and the round portions (40) formed at the boundaries between the inner circumferential surface of the coupling portion forming portion (17d) of the lower structural members (17) and the upper surfaces of the flat portions (22) of the lower structural member (17). Furthermore, the outward projecting portions (42b) are not formed in the annular portion (50a) of the first outward extending flange (50), and the annular portion (50a) has cutouts (51), which extend radially outward from the inner circumferential edge of the annular portion (50a) and are located at diametrically opposite positions and into which the horizontal flat portions (21) (22) are fitted.

Right end portions of the horizontal flat portion (21) (22) provided on the coupling portion forming portion (16d) (17d) of the pipe coupling portion (13) (15) of the casing (2) are partially cut removed from the right ends thereof toward the outer edges thereof with respect to the front-rear direction. The remaining portions of the right end portions of the horizontal flat portions (21) (22), located inward, of the cut portions with respect to the front-rear direction, are fitted into the cutouts (51) of the first outward extending flange (50). Furthermore, the horizontal flat portions (21) (22) have receiving portions (21b) (22b) formed on the left sides of the cut portions so as to receive portions of the annular portion (50a) of the first outward extending flange (50) located radially outward of the cutouts (51). The first outward extending flange (50) is brazed to the pipe coupling portion (13) (15) and the horizontal flat portion (21) (22) by making use of its own brazing material layer, in a state in which the annular portion (50a) is fitted onto the circumference of an end portion of the pipe coupling portion (13) (15), and portions of the horizontal flat portions (21) (22) projecting right ward in relation to the receiving portions (21b) (22b) are fitted into the cutouts (51). The right side surface (outer surface) of the first outward extending flange (50) is flush with the right end surface of the pipe coupling portion (13) (15) and the right end surfaces of the portions of the horizontal flat portions (21) (22) fitted into the cutouts (51).

The coupling auxiliary member (44) is not interposed between the first outward extending flange (50) and the second outward extending flange (46) of the inflow pipe (3) (the outflow pipe (4)); and the two outward extending flanges (50) (46) are directly brazed together. Furthermore, the outer circumferential edge of a region where the two outward extending flanges (50) (46) are brazed together is located radially outward of the round portions (40) formed at the boundaries between the inner circumferential surface of the coupling portion forming portion (16d) of the upper structural member (16) and the lower surfaces of the flat portions (21) of the upper structural member (16), and is also located radially outward of the round portions (40) formed at the boundaries between the inner circumferential surface of the coupling portion forming portion (17d) of the lower structural member (17) and the upper surfaces of the flat portions (22) of the lower structural member (17).

Accordingly, the second outward extending flange (46) completely covers the end surfaces (right end surfaces) of portions of the flat portions (21) (22) provided on the coupling portion forming portions (16d) (17d) of the pipe coupling portion (13) (15) of the refrigerant inflow section (9) (the refrigerant outflow section (11)), the portions being fitted into the cutouts (51) of the first outward extending flange (50). As a result, the second outward extending flange (46) completely closes the open ends of the clearances (41) located on the side (right side) toward the first outward extending flange (50), the clearances (41) being formed between the inflow pipe (3) and the outflow pipe (4) and the inner circumferential surfaces of the pipe coupling portions (13) (15) formed by the coupling portion forming portions (16d) (17d) of the upper and lower structural members (16) (17). Accordingly, leakage of fluid from the casing (2) can be prevented. As described above, the clearances (41) are formed as a result of formation of the round portions (40) at the boundaries between the inner circumferential surface of each coupling portion forming portion (16d) and the surfaces of the flat portions (21) facing the direction toward which the coupling portion forming portion (16d) is open and at the boundaries between the inner circumferential surface of each coupling portion forming portion (17d) and the surfaces of the flat portions (22) facing the direction toward which the coupling portion forming portion (17d) is open.

The remaining structure is the same as the pipe coupling structure of Embodiment 1.

Simultaneously with manufacture of the liquid-cooled-type cooling apparatus (1), the inflow pipe (3) and the outflow pipe (4) are connected to the pipe coupling portions (13) (15) of the casing (2) by a method to be described below. That is, the upper and lower structural members (16) (17), the first outward extending flanges (50), the inflow pipe (3), and the outflow pipe (4) are prepared; and the upper and lower structural members (16) (17) are assembled together so that the outward extending portions (18) (19) come into close contact with each other (see FIG. 16(a)). At that time; the corrugate fin (23) is disposed between the upper and lower structural members (16) (17). Subsequently, the annular portion (50a) of the first outward extending flange (50) is fitted onto the circumference of the pipe coupling portion (13) (15) so that the remaining portions of the right ends of the horizontal flat portions (21) (22) are fitted into the cutouts (51); and the annular portion (50a) is brought into contact with the receiving portions (21b) (22b) of the horizontal flat portions (21) (22) (see FIG. 16(b)). Subsequently, the to-be-inserted portion (45) of the cooling-liquid inflow pipe (3) (the cooling-liquid outflow pipe (4)) is passed through the annular portion (50a) of the first outward extending flange (50), and inserted into the pipe coupling portion (13) (15); and the second outward extending flange (46) is brought into contact with the outer surface (right side surface) of the first outward extending flange (50) (see FIG. 16(c)). Subsequently, the upper and lower structural members (16) (17), the first outward extending flange (50), and the cooling-liquid inflow pipe (3) (the cooling-liquid outflow pipe (4)) are provisionally fixed together by use of unillustrated proper means, and are heated to a predetermined brazing temperature so as to braze together the outward extending portions (18) (19) of the upper and lower structural members (16) (17), to thereby form the casing (2). Simultaneously with this, brazing is effected between the first outward extending flange (50) and the pipe coupling portion (13) (the pipe coupling portion (15)) and the horizontal flat portions (21) (22), between the first outward extending flange (50) and the second outward extending flange (46), and between the to-be-inserted portion (45) of the cooling-liquid inflow pipe (3) (the cooling-liquid outflow pipe (4)) and the pipe coupling portion (13) (the pipe coupling portion (15)). Thus, the liquid-cooled-type cooling apparatus (1) is completed.

Embodiment 4

FIGS. 17 to 19 show the present embodiment in which the structure for coupling a pipe to a hollow component according to the present invention is applied to connection of inflow and outflow pipes to pipe coupling portions of the casing of a liquid-cooled-type cooling apparatus.

In the case of the structure according to the present embodiment for coupling the inflow pipe (3) and the outflow pipe (4) to the pipe coupling portions (13) (15) of the casing (2), the cutouts (51) are not formed in a first outward extending flange (55) provided at the distal end portion of the pipe coupling portion (13) (15) so that the flange surrounds the coupling portion forming portions (16d) (17d) and the horizontal flat portions (21) (22) of the upper and lower structural members (16) (17). The outer circumferential edge of the annular portion (55a) of the first outward extending flange (55) is located radially outward of the round portions (40) formed at the boundaries between the inner circumferential surface of the coupling portion forming portion (16d) of the upper structural members (16) and the lower surfaces of the flat portions (21) of the upper structural member (16) and the round portions (40) formed at the boundaries between the inner circumferential surface of the coupling portion forming portion (17d) of the lower structural members (17) and the upper surfaces of the flat portions (22) of the lower structural member (17). Furthermore, the first outward extending flange (55) has inward projecting portions (55b) which are integrally formed at opposite side potions of the annular portion (55a) with respect to the front-rear direction such that the inward projecting portions (55b) project radially inward and are located at diametrically opposite positions. The inner edges of the inward projecting portions (55b) assume the form of an arc which is equal in curvature to the inner circumferential surface of the pipe coupling portion (13) (15) and the outer circumferential surfaces of the inflow pipe (3) and the outflow pipe (4).

Cutouts (56) are formed at a right end portion of the pipe coupling portion (13) (15) of the casing (2) so that the cutouts (56) extend over the coupling portion forming portions (16d) (17d), and are located at diametrically opposite positions. The inward projecting portions (55b) of the first outward extending flange (55) are fitted into the cutouts (56). Right end portions of the horizontal flat portions (21) (22) provided on the coupling portion forming portions (16d) (17d) of the pipe coupling portion (13) (15) are cut removed over a distance equal to the depth (the dimension in the left-right direction) of the cutouts (56) so as not to interfere with the annular portion (55a) of the first outward extending flange (55). Furthermore, receiving portions (21c) (22c) are formed at the right ends of the remaining potions of the horizontal flat portions (21) (22) so as to receive the annular portion (55a) of the first outward extending flange (55). The first outward extending flange (55) is brazed to the pipe coupling portion (13) (15) and the horizontal flat portions (21) (22) by making use of its own brazing material layer, in a state in which the annular portion (55a) is fitted onto the circumference of an end portion of the pipe coupling portion (13) (15), and the inward projecting portions (55b) are fitted into the cutouts (56). The right side surface (outer surface) of the first outward extending flange (55) is flush with the right end surface of the pipe coupling portion (13) (15), excluding the cutouts (56).

The remaining structure is the same as the pipe coupling structure of Embodiment 3. The outer circumferential edge of a region where the two outward extending flanges (55) (46) are brazed together is located radially outward of the round portions (40) formed at the boundaries between the inner circumferential surface of the coupling portion forming portion (16d) of the upper structural member (16) and the lower surfaces of the flat portions (21) of the upper structural member (16), and is also located radially outward of the round portions (40) formed at the boundaries between the inner circumferential surface of the coupling portion forming portion (17d) of the lower structural member (17) and the upper surfaces of the flat portions (22) of the lower structural member (17). Accordingly, the second outward extending flange (46) completely covers the end surfaces (right end surfaces) of the flat portions (21) (22) formed on the coupling portion forming portions (16d) (17d) of the pipe coupling portion (13) (15) of the refrigerant inflow section (9) (the refrigerant outflow section (11)). As a result, the second outward extending flange (46) completely closes the open ends of the clearances (41) located on the side (right side) toward the first outward extending flange (55), the clearances (41) being formed between the inflow pipe (3) and the outflow pipe (4) and the inner circumferential surfaces of the pipe coupling portions (13) (15) formed by the coupling portion forming portions (16d) (17d) of the upper and lower structural members (16) (17). Accordingly, leakage of fluid from the casing (2) can be prevented. As described above, the clearances (41) are formed as a result of formation of the round portions (40) at the boundaries between the inner circumferential surface of each coupling portion forming portion (16d) and the surfaces of the flat portions (21) facing the direction toward which the coupling portion forming portion (16d) is open and at the boundaries between the inner circumferential surface of each coupling portion forming portion (17d) and the surfaces of the flat portions (22) facing the direction toward which the coupling portion forming portion (17d) is open.

Simultaneously with manufacture of the liquid-cooled-type cooling apparatus (1), the inflow pipe (3) and the outflow pipe (4) are connected to the pipe coupling portions (13) (15) of the casing (2) by a method to be described below. That is, the upper and lower structural members (16) (17), the first outward extending flanges (55), the inflow pipe (3), and the outflow pipe (4) are prepared; and the upper and lower structural members (16) (17) are assembled together so that the outward extending portions (18) (19) come into close contact with each other (see FIG. 19(a)). At that time, the corrugate fin (23) is disposed between the upper and lower structural members (16) (17). Subsequently, the annular portion (55a) of the first outward extending flange (55) is fitted onto the circumference of the pipe coupling portion (13) (15) so that the inward projecting portions (55b) are fitted into the cutouts (56); and the annular portion (55a) is brought into contact with the receiving portions (21c) (22c) of the horizontal flat portions (21) (22) (see FIG. 19(b)). Subsequently, the to-be-inserted portion (45) of the cooling-liquid inflow pipe (3) (the cooling-liquid outflow pipe (4)) is passed through the annular portion (55a) of the first outward extending flange (55), and inserted into the pipe coupling portion (13) (15); and the second outward extending flange (46) is brought into contact with the outer surface (right side surface) of the first outward extending flange (55) (see FIG. 19(c)). Subsequently, the upper and lower structural members (16) (17), the first outward extending flange (55), and the cooling-liquid inflow pipe (3) (the cooling-liquid outflow pipe (4)) are provisionally fixed together by use of unillustrated proper means, and are heated to a predetermined brazing temperature so as to braze together the outward extending portions (18) (19) of the upper and lower structural members (16) (17), to thereby form the casing (2). Simultaneously with this, brazing is effected between the first outward extending flange (55) and the pipe coupling portion (13) (the pipe coupling portion (15)) and the horizontal flat portions (21) (22), between the first outward extending flange (55) and the second outward extending flange (46), and between the to-be-inserted portion (45) of the cooling-liquid inflow pipe (3) (the cooling-liquid outflow pipe (4)) and the pipe coupling portion (13) (the pipe coupling portion (15)). Thus, the liquid-cooled-type cooling apparatus (1) is completed.

In all the embodiments described above, since each of the inflow pipe (3) and the outflow pipe (4) is formed of a round pipe, the pipe coupling portions (13) (15) of the cooling-liquid inflow section (9) and the refrigerant outflow section (11) of the casing (2) assume a cylindrical tubular shape, and the coupling portion forming portions (16d) (17d) of the upper and lower structural members (16) (17) assume a semi-cylindrical tubular shape. However, the shapes of these portions are not limited thereto. The transverse cross sectional shape of the inflow pipe (3) and the outflow pipe (4) can be freely changed to an elliptical shape, an oblong shape, a polygonal shape, or the like. Further, the shapes of the pipe coupling portions (13) (15) of the cooling-liquid inflow section (9) and the refrigerant outflow section (11) of the casing (2), and/or the shape of the coupling portion forming portions (16d) (17d) of the upper and lower structural members (16) (17) can be freely changed in accordance with the transverse cross sectional shapes of the inflow pipe (3) and the outflow pipe (4).

Industrial Applicability

The method of manufacturing a pipe coupling component according to the present invention is applied to manufacture of a pipe coupling component used in a liquid-cooled-type cooling device for cooling a heat-generating body composed of an electronic component such as a semiconductor device. Further, the structure for coupling a pipe to a hollow component according to the present invention is applied to connection of pipes to a hollow component used in a liquid-cooled-type cooling device for cooling a heat-generating body composed of an electronic component such as a semiconductor device.

Figure 1:
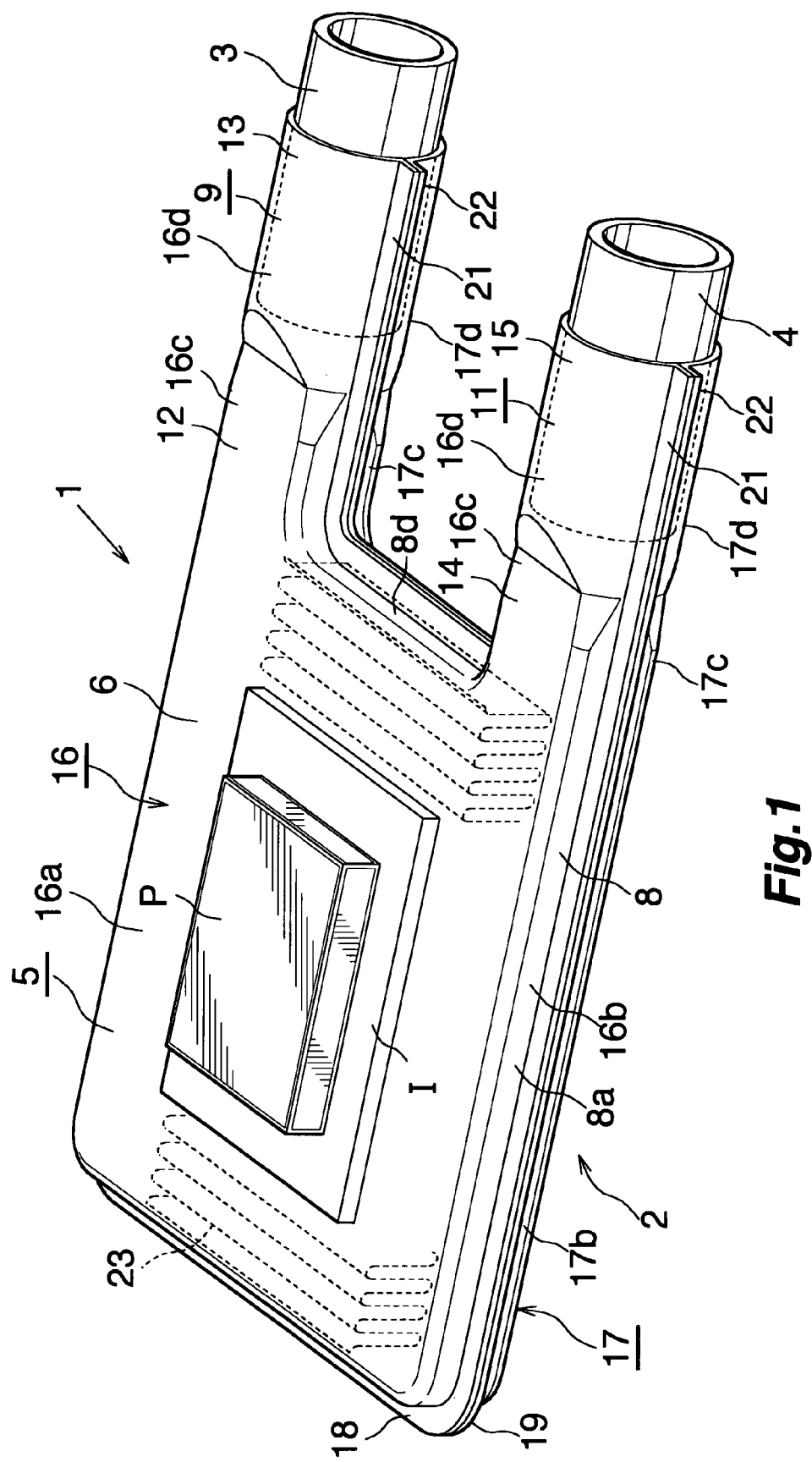
FIG. 1 is a perspective view showing the overall structure of a liquid-cooled-type cooling apparatus including a casing composed of structural members manufactured by the method of manufacturing casing structural members according to the present invention.
Figure 2:
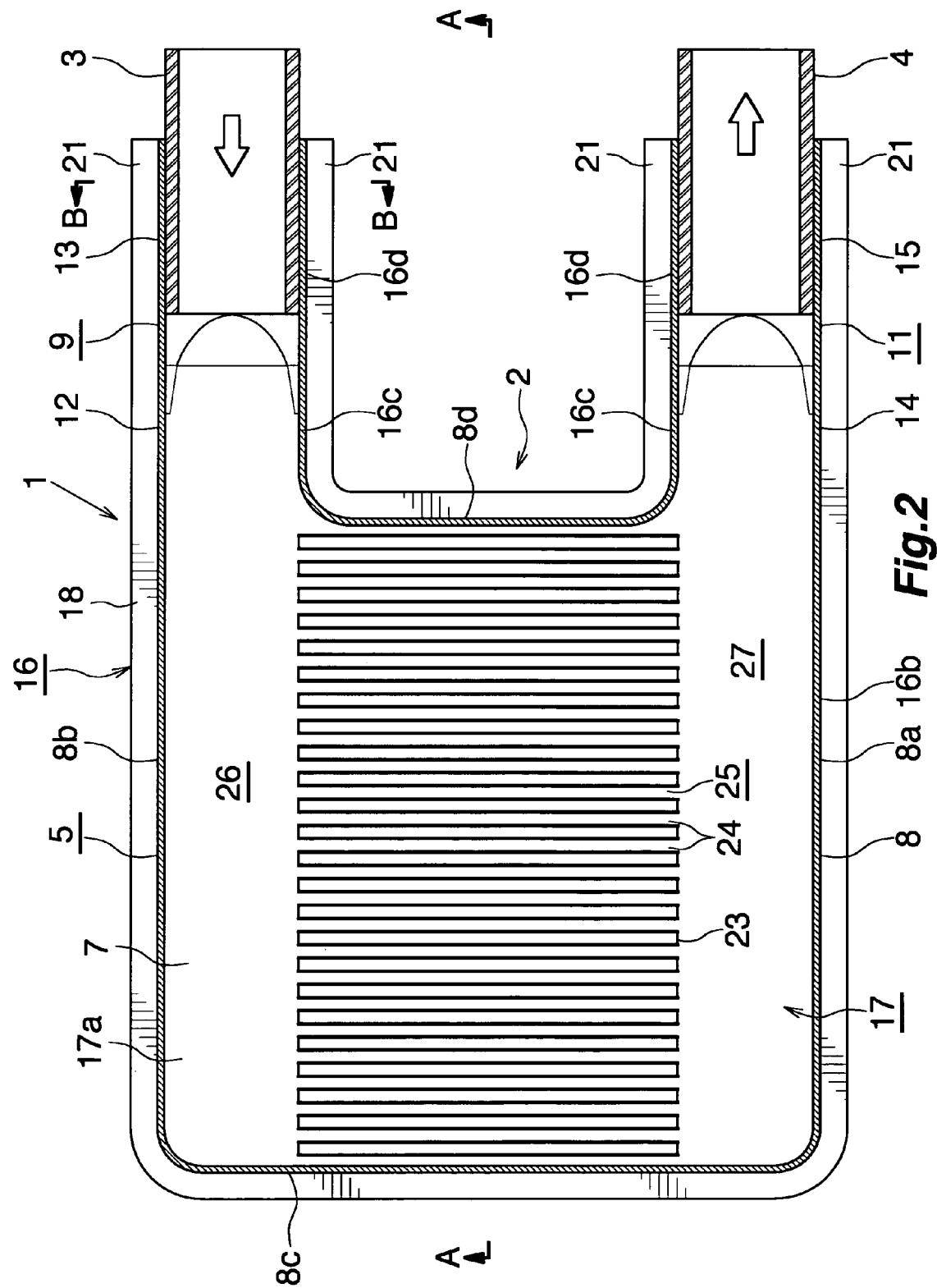
FIG. 2 is a horizontal sectional view of the liquid-cooled-type cooling apparatus of FIG. 1.
Figure 3:
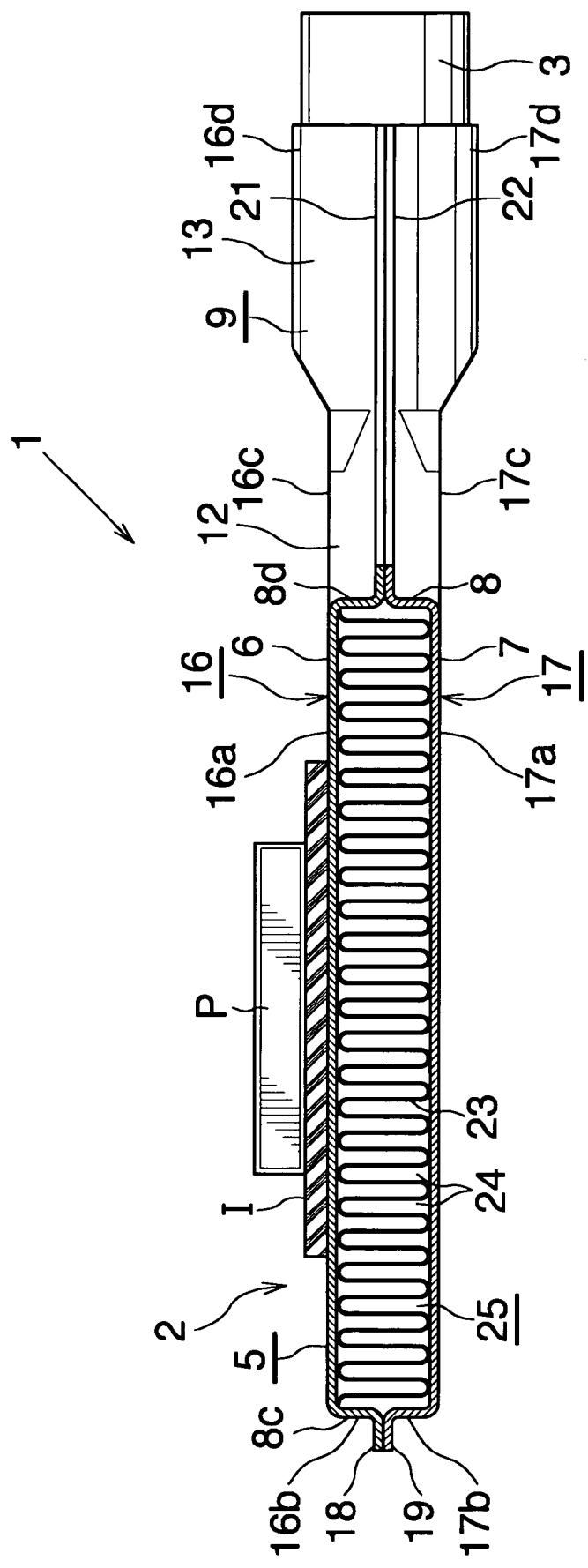
FIG. 3 is a sectional view taken along line A-A, of FIG. 2.
Figure 4:
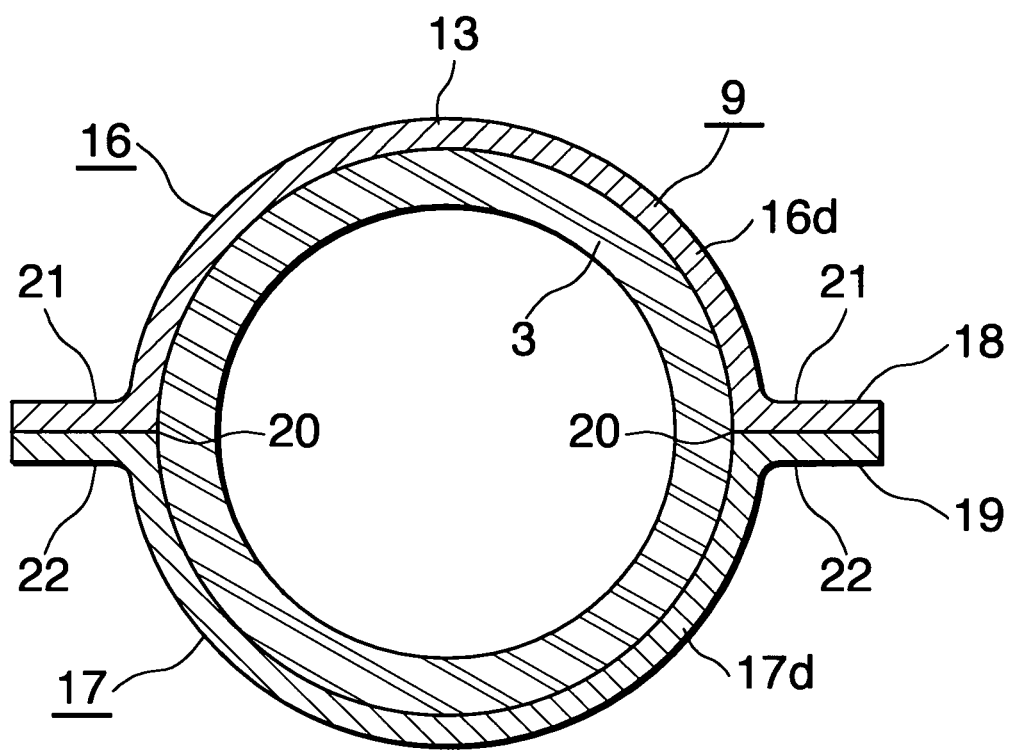
FIG. 4 is an enlarged sectional view taken along line B-B of FIG. 2.
Figure 5:
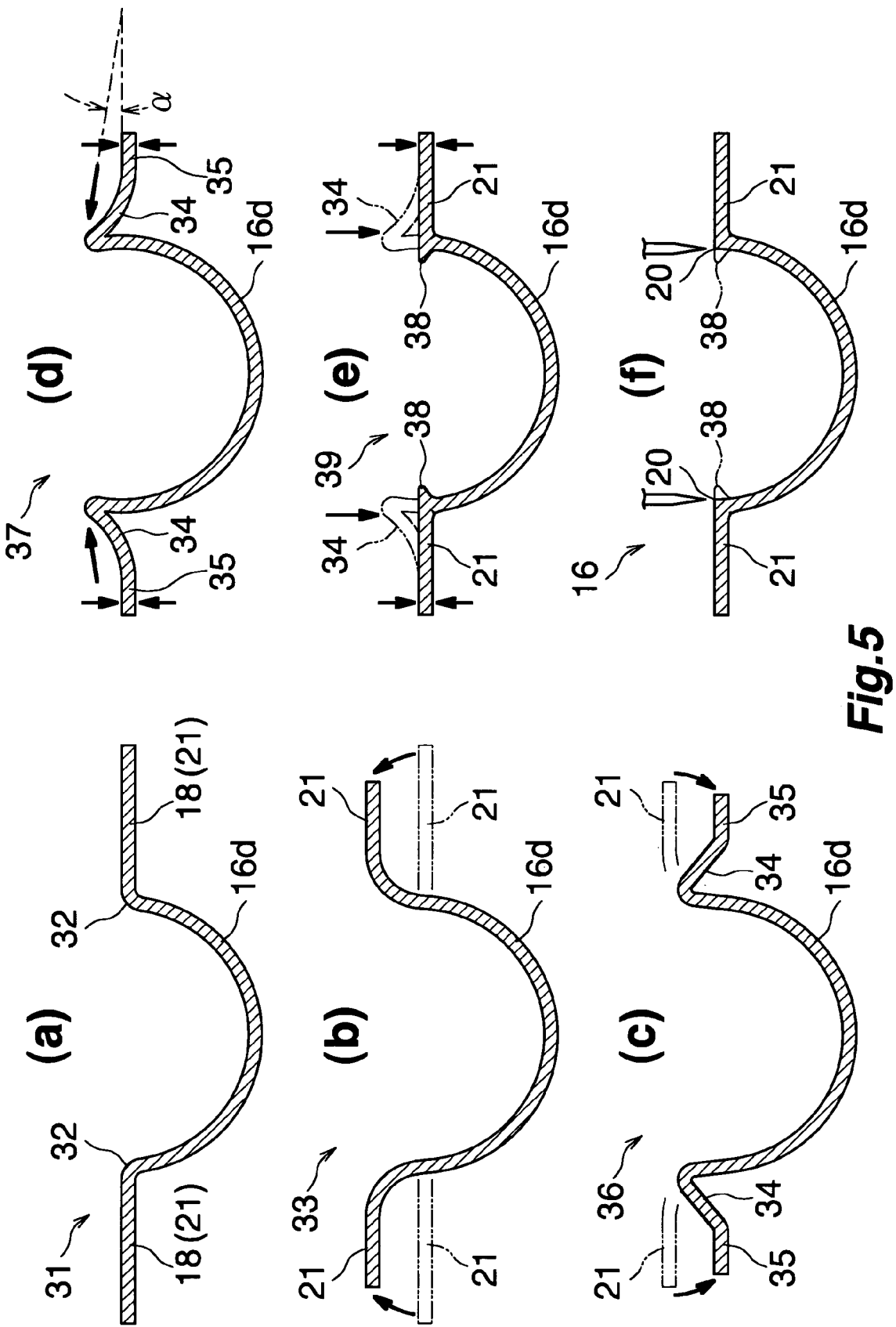
FIG. 5 is a set of enlarged sectional views of a coupling portion forming portion, showing the steps of a method of manufacturing an upper structural member of the casing of the liquid-cooled-type cooling apparatus of FIG. 1.
Figure 6:
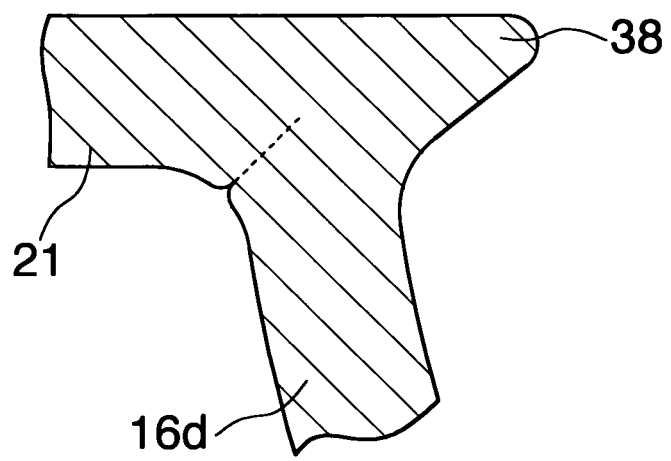
FIG. 6 is a view showing, on an enlarged scale, a main portion of FIG. 5(e).
Figure 7:
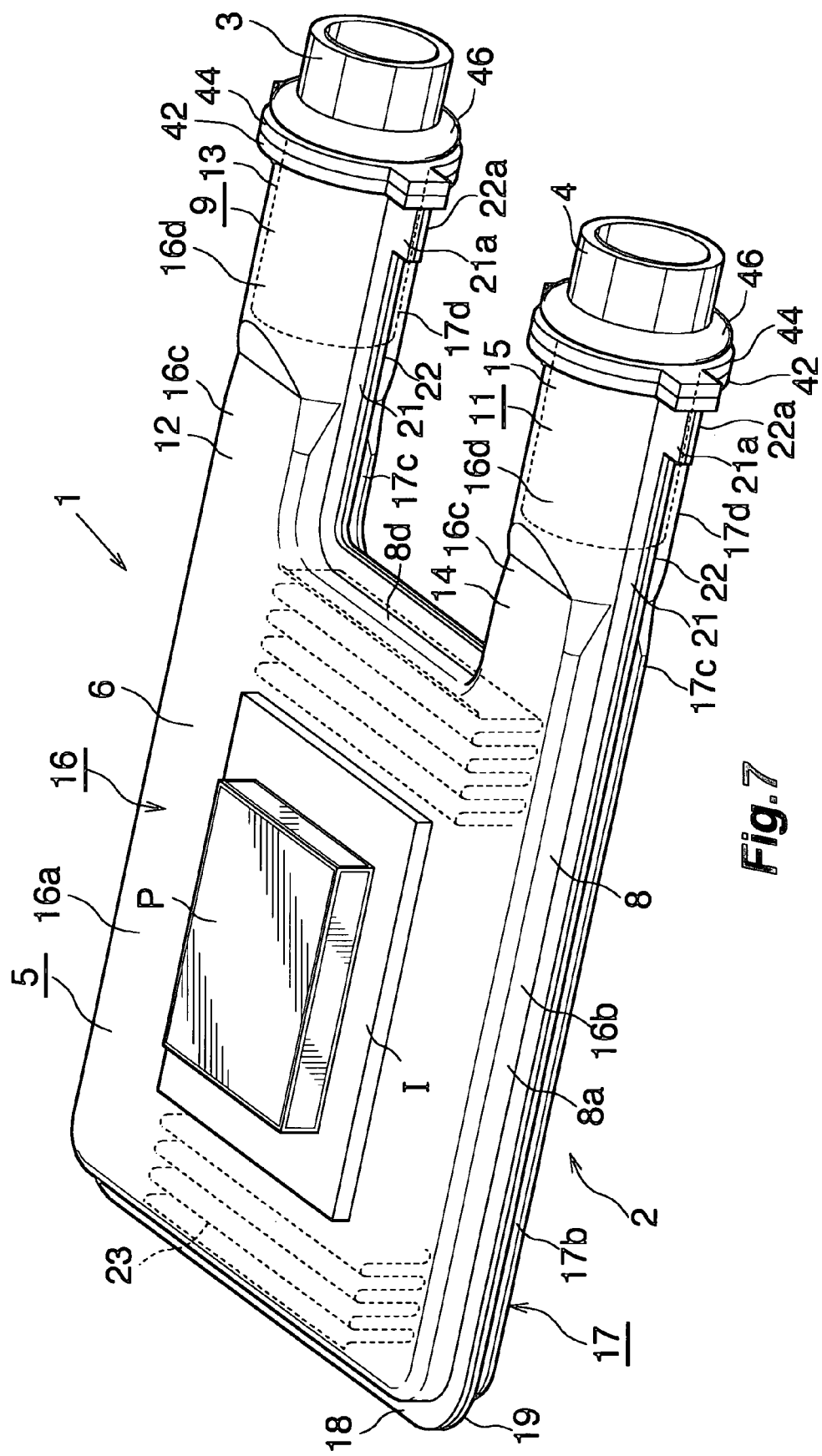
FIG. 7 is a perspective view showing the overall structure of a liquid-cooled-type cooling apparatus in which a pipe coupling structure of Embodiment 2 of the present invention is applied to connection of inflow and outflow pipes to pipe coupling portions of the casing.
Figure 8:
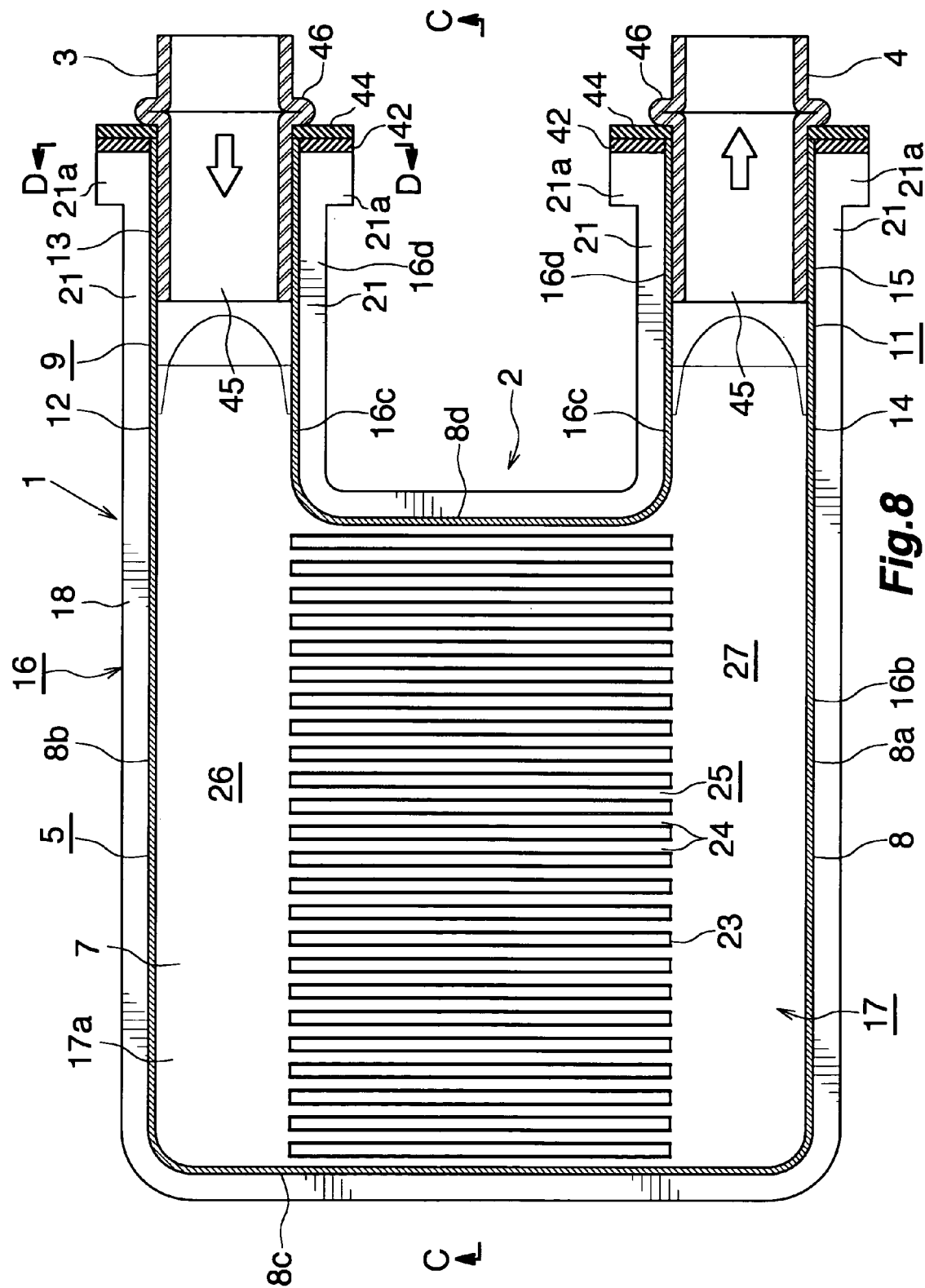
FIG. 8 is a horizontal sectional view of the liquid-cooled-type cooling apparatus of FIG. 7.
Figure 9:
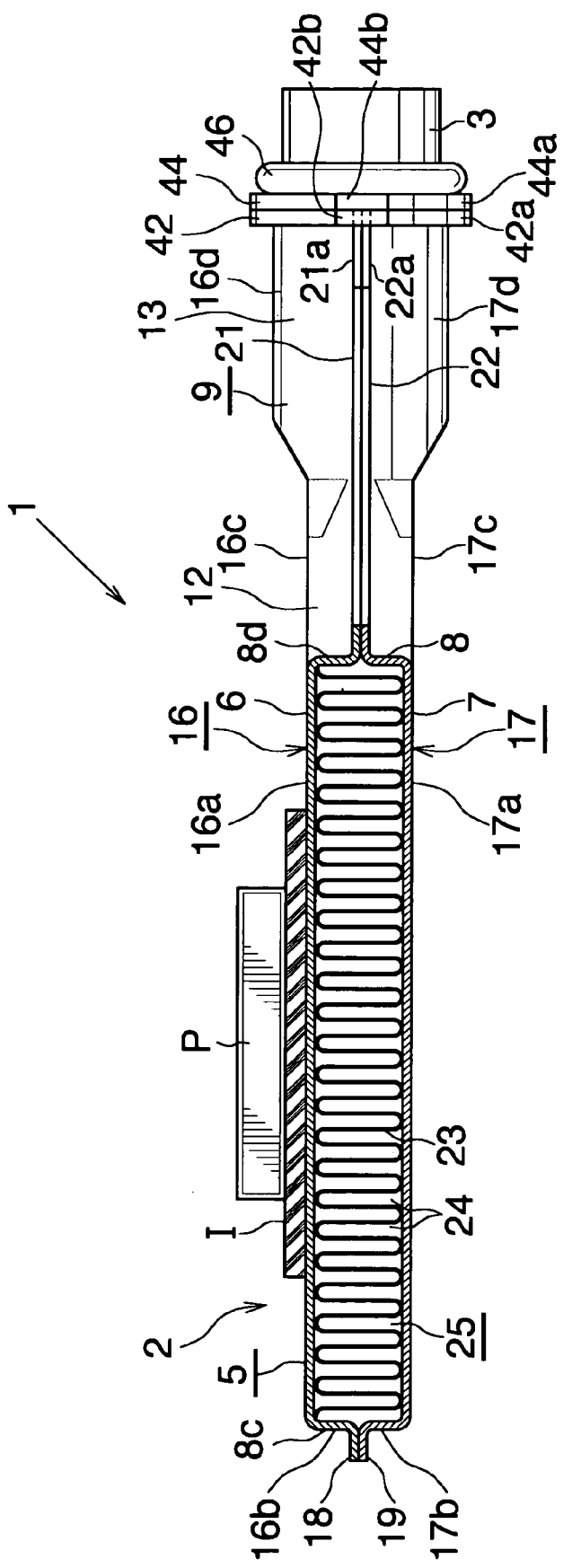
FIG. 9 is a sectional view taken along line C-C of FIG. 8.
Figure 10:
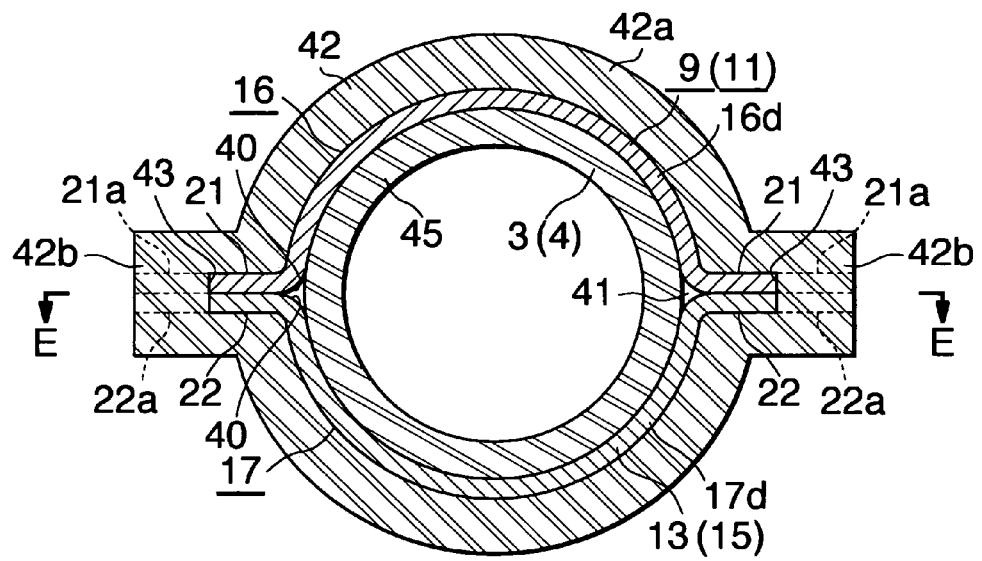
FIG. 10 is an enlarged sectional view taken along line D-D of FIG. 8.
Figure 11:
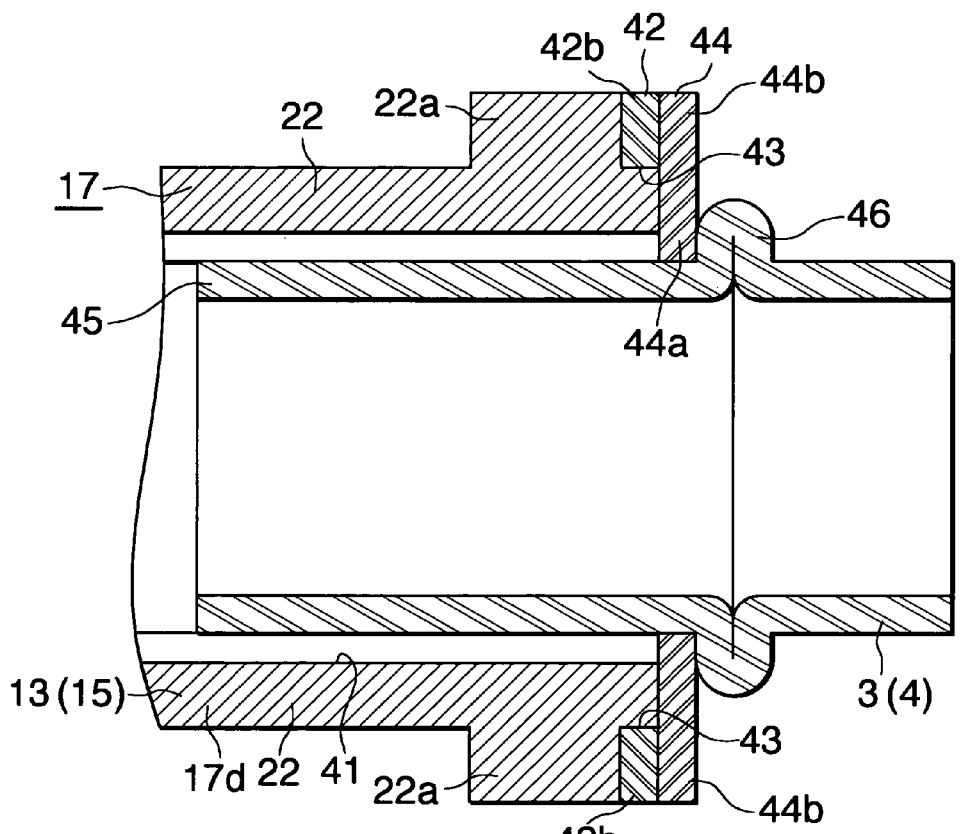
FIG. 11 is a sectional view taken along line E-E of FIG. 10.
Figure 12:
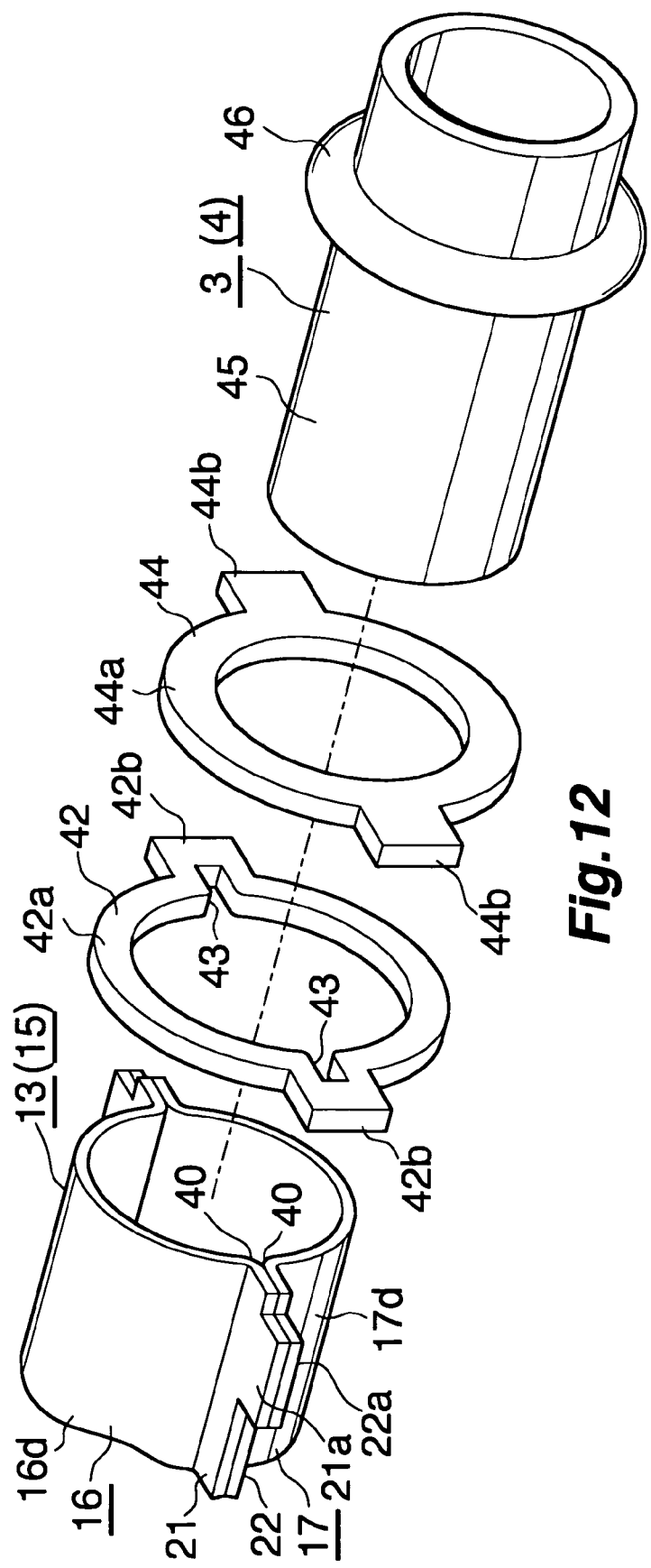
FIG. 12 is a perspective view showing a step of a method of connecting inflow and outflow pipes to the pipe coupling portions of the casing of the liquid-cooled-type cooling apparatus of FIG. 7.
Figure 13:
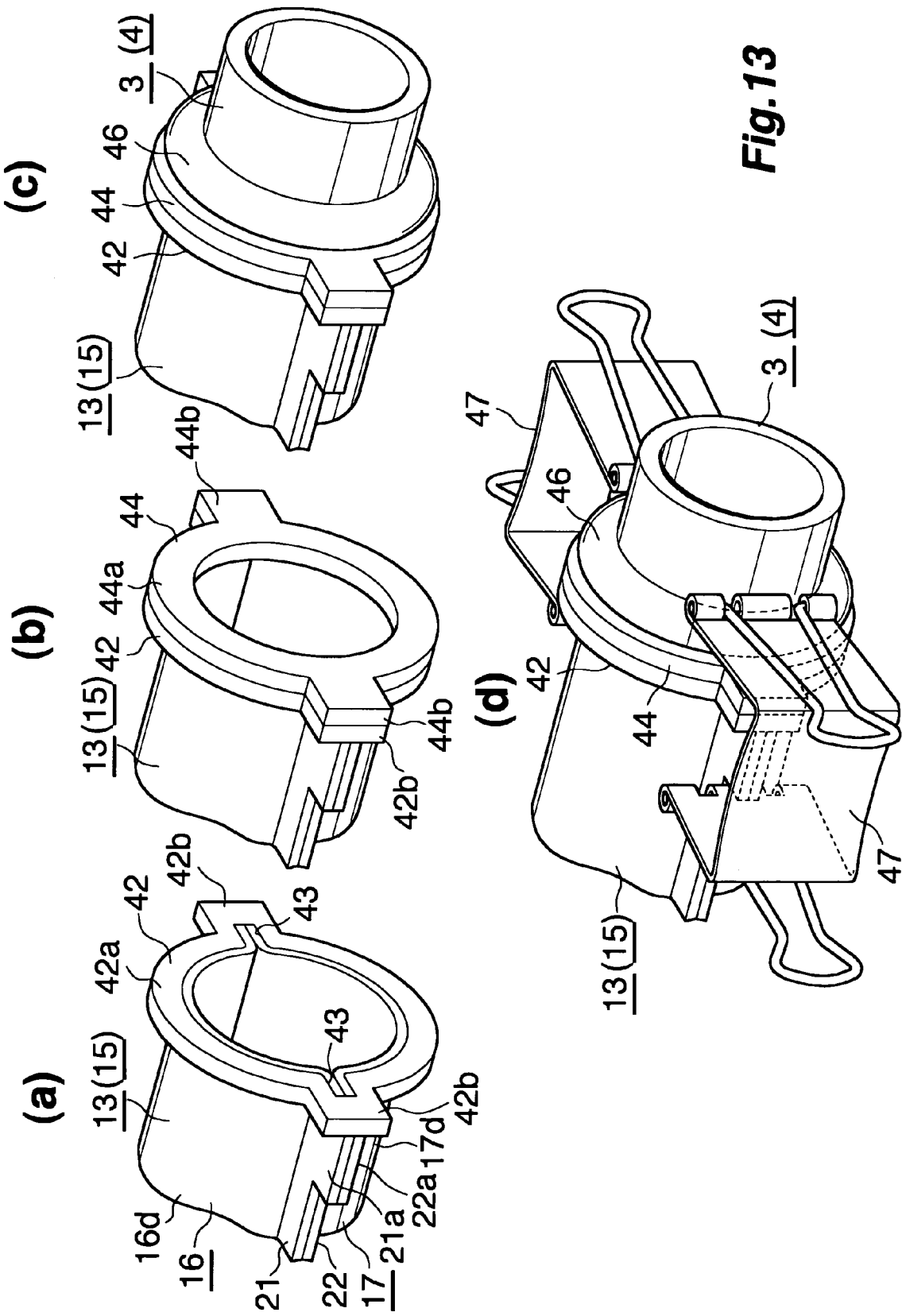
FIG. 13 is a set of perspective views showing steps, subsequent to the step shown in FIG. 12, of the method of connecting inflow and outflow pipes to the pipe coupling portions of the casing of the liquid-cooled-type cooling apparatus of FIG. 7.
Figure 14:
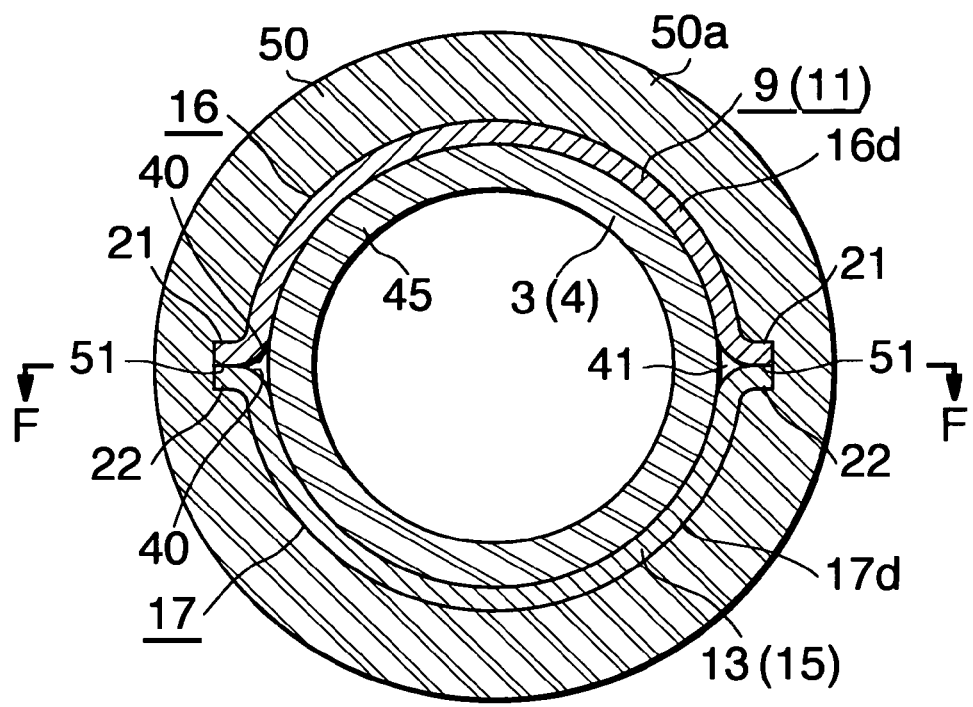
FIG. 14 is a sectional view corresponding to FIG. 10, and showing a main portion of a liquid-cooled-type cooling apparatus in which a pipe coupling structure of Embodiment 3 of the present invention is applied to connection of inflow and outflow pipes to pipe coupling portions of a casing.
Figure 15:
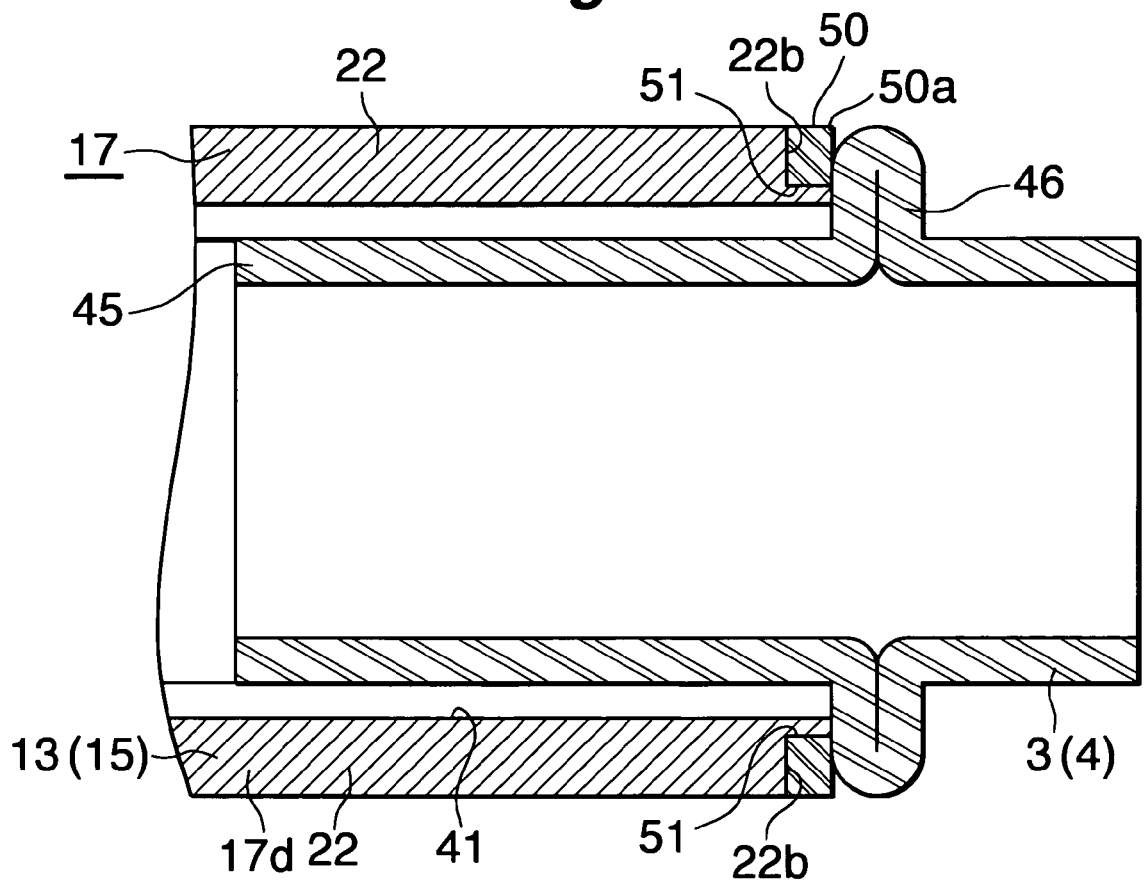
FIG. 15 is a sectional view taken along line F-F of FIG. 14.
Figure 16:
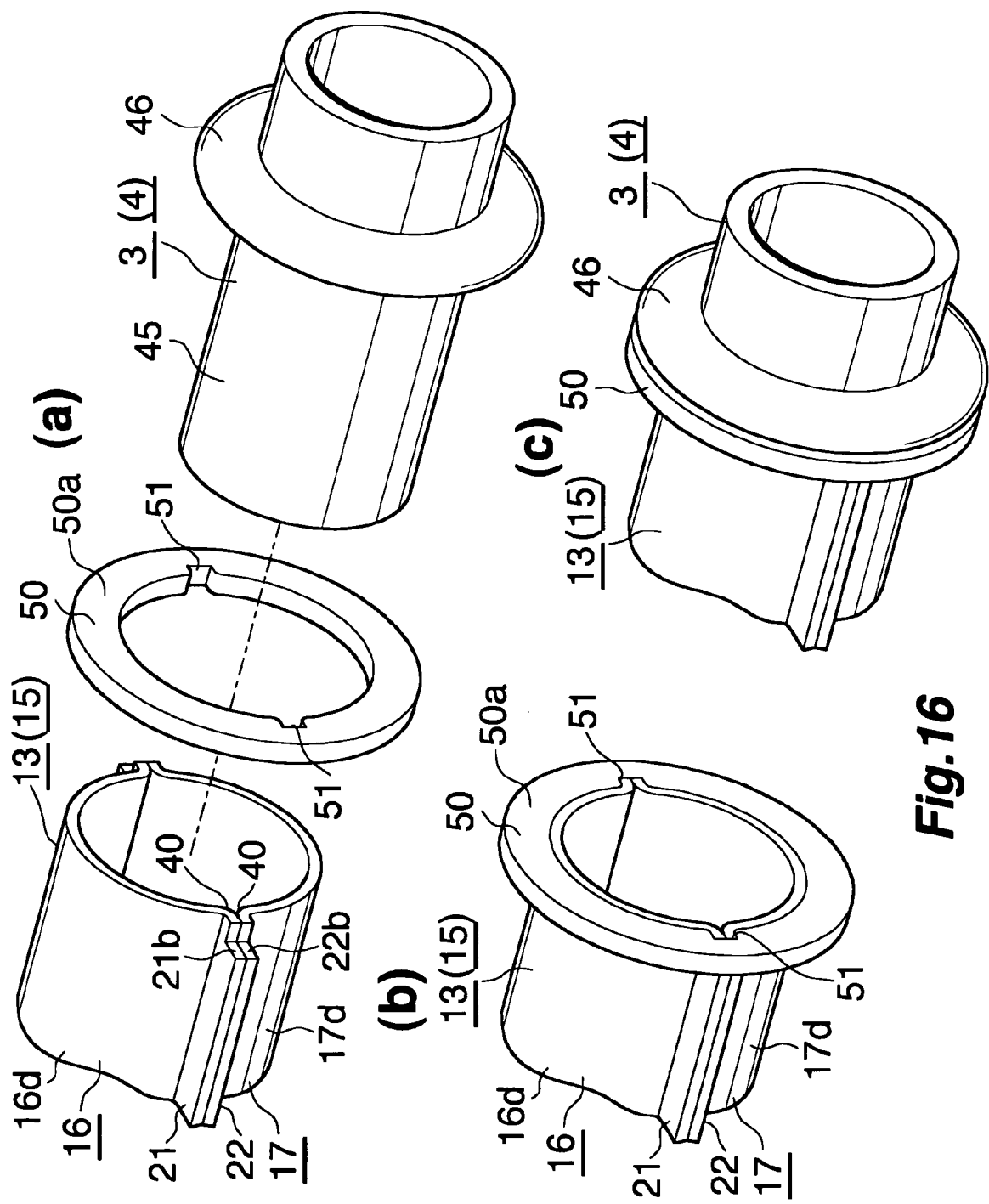
FIG. 16 is a set of perspective views showing a method of connecting inflow and outflow pipes to the pipe coupling portions of the casing of the liquid-cooled-type cooling apparatus of FIG. 14.
Figure 17:
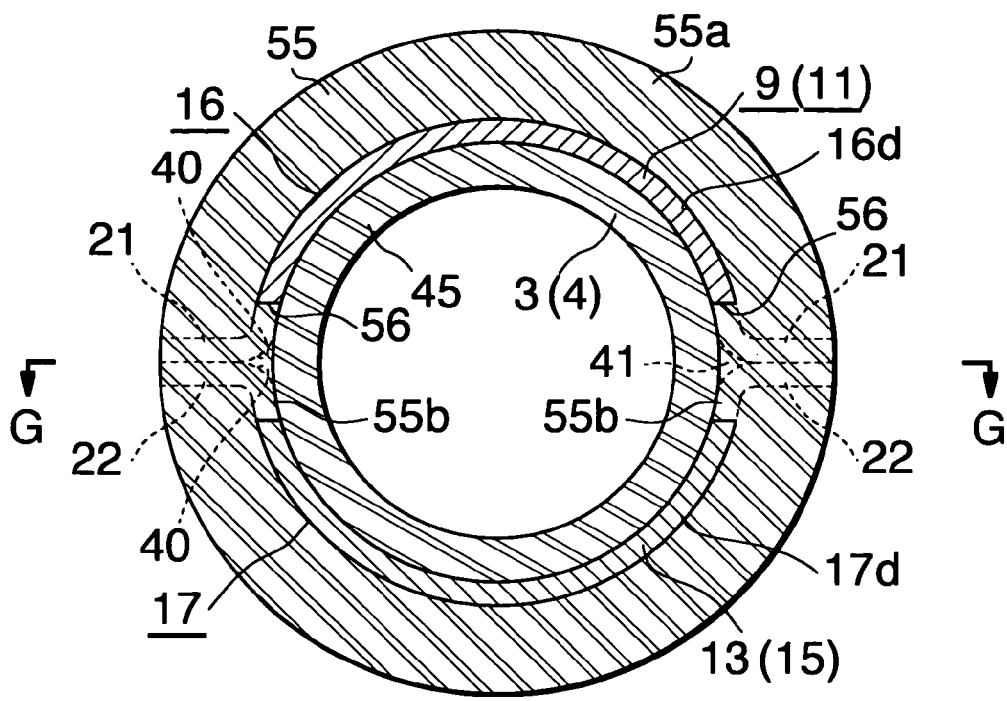
FIG. 17 is a sectional view corresponding to FIG. 10, and showing a main portion of a liquid-cooled-type cooling apparatus in which a pipe coupling structure of Embodiment 4 of the present invention is applied to connection of inflow and outflow pipes to pipe coupling portions of a casing.
Figure 18:
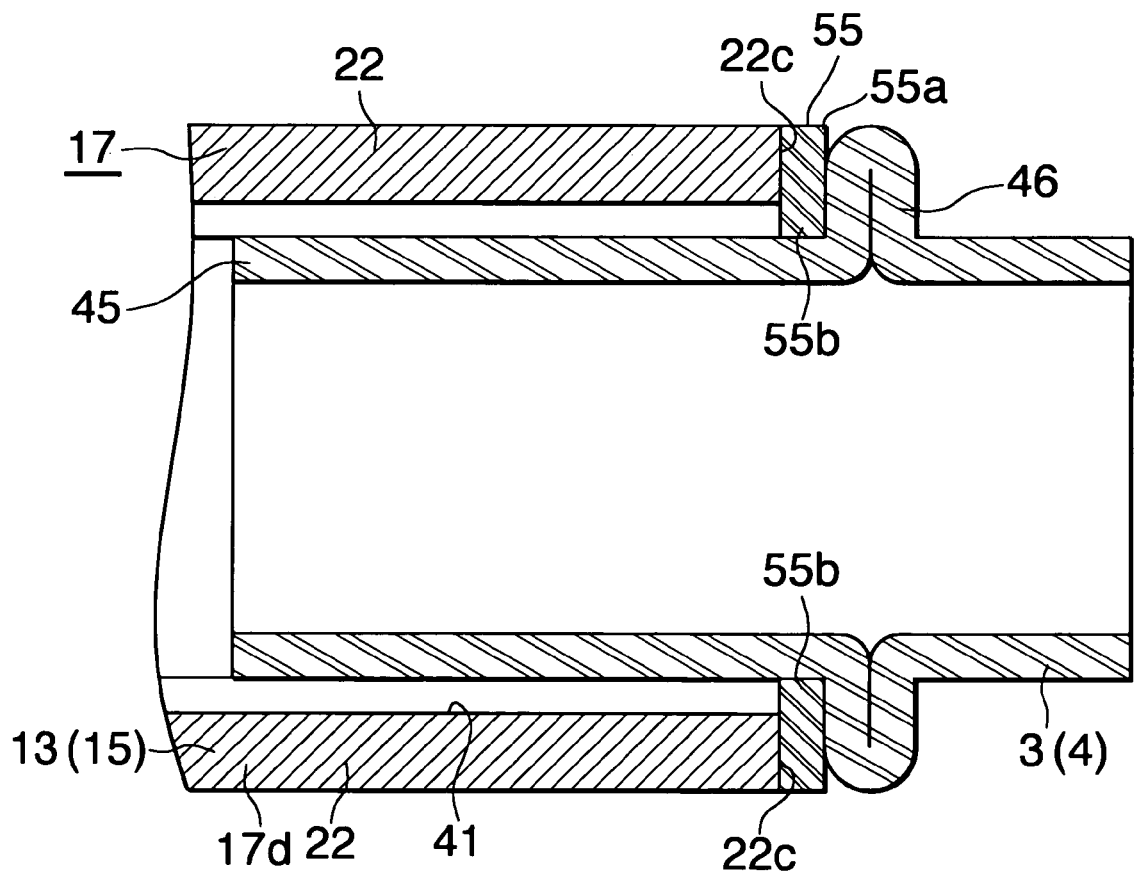
FIG. 18 is a sectional view taken along line G-G of FIG. 17.
Figure 19:
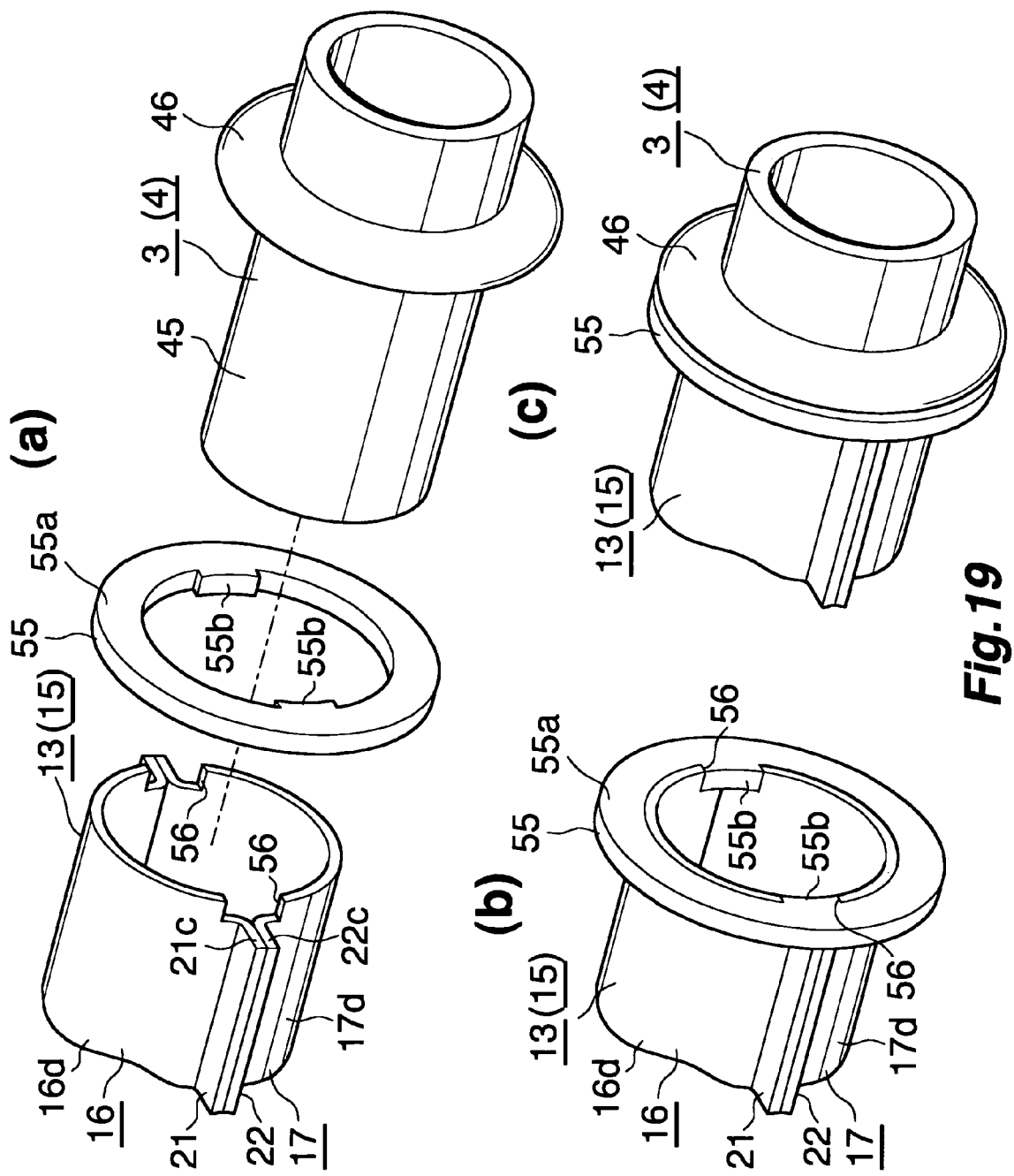
FIG. 19 is a set of perspective views showing a method of connecting inflow and outflow pipes to the pipe coupling portions of the casing of the liquid-cooled-type cooling apparatus of FIG. 17.
Figure 20:
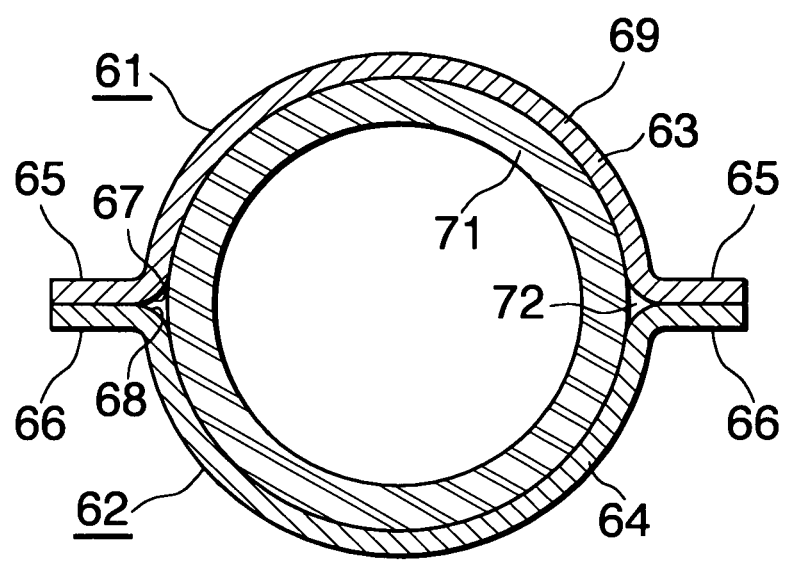
FIG. 20 is a sectional view corresponding to FIG. 4, and showing a problem of a liquid-cooled-type cooling apparatus including a casing composed of structural members manufactured by a conventional method.

The invention claimed is:

1. A method of manufacturing a pipe coupling component including a semi-tubular portion which is to come into close contact with a half of an outer circumferential surface of a pipe, and flat portions which are integrally formed along opposite side edges of the semi-tubular portion and are located on a common plane, wherein edge portions are formed at boundaries between an inner circumferential surface of the semi-tubular portion and surfaces of the flat portions, the surfaces facing a direction toward which the semi-tubular portion is open, the method comprising:
a first step of providing two dies;
a second step of producing a first intermediate product by performing press work on a metal blank plate using the two dies, each die having a shape corresponding to a final shape of the first intermediate product, the first intermediate product including the semi-tubular portion, and the flat portions which are integrally formed along opposite side edges of the semi-tubular portion and are located on the common plane, wherein round portions are formed at boundaries between the inner circumferential surface of the semi-tubular portion and surfaces of the flat portions, the surfaces facing a direction toward which the semi-tubular portion is open;
a third step of deforming the flat portions of the first intermediate product so that the flat portions move toward the direction toward which the semi-tubular portion is open, to thereby produce a second intermediate product which is larger in bending depth of the semi-tubular portion and smaller in width of the flat portions than the first intermediate product;
a fourth step of bending portions of the flat portions of the second intermediate product located on the side toward the semi-tubular portion so that the bent portions form acute angles in relation to opposite side walls of the semi-tubular portion and form obtuse angles in relation to outer portions of the flat portions, to thereby produce a third intermediate product which includes the semi-tubular portion, sloping flat portions extending from the opposite side walls of the semi-tubular portion, and narrow flat portions extending from distal edges of the sloping flat portions, the narrow flat portions being located on the common plane, and being narrower than the flat portions of the second intermediate product;
a fifth step of pushing the sloping flat portions of the third intermediate product, in a direction away from a bottom portion of the semi-tubular portion, toward the side walls of the semi-tubular portion, while restraining distal edge portions of the narrow flat portions, so as to move material of the third intermediate product to boundaries between the sloping flat portions and the side walls of the semi-tubular portion, to thereby produce a fourth intermediate product;
a sixth step of pressing, from upper and lower sides, opening-side portions of the side walls of the semi-tubular portion, the sloping flat portions, and the narrow flat portions of the fourth intermediate product, to thereby produce a fifth intermediate product which includes the semi-tubular portion having the same depth as the metal component of the final shape, and final flat portions extending from opposite side walls of the semi-tubular portions and being identical in shape and dimension with the meal component of the final shape, wherein burrs project toward an interior of the semi-tubular portion from opening-side end portions of the side walls of the semi-tubular portion; and
a seventh step of removing the burrs from the fifth intermediate product, to thereby produce the metal component of the final shape which includes the semi-tubular portion which is to come into close contact with an outer circumferential surface of a pipe, and the final flat portions which are integrally formed along opposite side edges of the semi-tubular portion and are located on the common plane, wherein edge portions are formed at boundaries between the inner circumferential surface of the semi-tubular portion and surfaces of the final flat portions, the surfaces facing a direction toward which the semi-tubular portion is open.

2. A method of manufacturing a pipe coupling component according to claim 1, wherein the direction in which the sloping flat portions are pushed in the fifth step inclines 5 to 20 degrees in relation to the plane on which the narrow flat portions are located.

3. A method of manufacturing upper and lower structural members used in a casing comprising a casing main body which is composed of a top wall, a bottom wall, and a circumferential wall and through which fluid flows; and a fluid passage section provided on the casing main body and composed of a base portion communicating with the interior of the casing main body, and a tubular pipe coupling portion extending from a distal end of the base portion, wherein the upper structural member forms the top wall of the casing main body, an upper half portion of the circumferential wall of the casing main body, an upper half portion of the base portion of the fluid passage section, and an upper half portion of the pipe coupling portion of the fluid passage section; and the lower structural member forms the bottom wall of the casing main body, a lower half portion of the circumferential wall of the casing main body, a lower half portion of the base portion of the fluid passage section, and a lower half portion of the pipe coupling portion of the fluid passage section, the method comprising:

a first step of producing a first intermediate product for the upper structural member by performing press work on a metal blank plate using two dies, each die having a shape corresponding to a final shape of the upper structural member, the first intermediate product including a top wall forming portion that forms the top wall of the casing main body, a circumferential wall forming portion that forms the upper half portion of the circumferential wall of the casing main body, a base portion forming portion that forms the upper half portion of the base portion of the fluid passage section, a semi-tubular coupling portion forming portion that forms the upper half portion of the pipe coupling portion of the fluid passage section, and flat portions integrally formed along opposite side edges of the coupling portion forming portion and being located on the common plane, wherein round portions are formed at boundaries between the inner circumferential surface of the coupling portion forming portion and surfaces of the flat portions facing a direction toward which the coupling portion forming portion is open;

a second step of producing a second intermediate product for the lower structural member by performing press work on a metal blank plate using two dies, each die having a shape corresponding to a final shape of the lower structural member, the second intermediate product including a bottom wall forming portion that forms the bottom wall of the casing main body, a circumferential wall forming portion that forms the lower half portion of the circumferential wall of the casing main body, a base portion forming portion that forms the lower half portion of the base portion of the fluid passage section, a semi-tubular coupling portion forming portion that forms the lower half portion of the pipe coupling portion of the fluid passage section, and the flat portions integrally formed along opposite side edges of the coupling portion forming portion and being located on the common plane, wherein round portions are formed at boundaries between the inner circumferential surface of the coupling portion forming portion and surfaces of the flat portions facing a direction toward which the coupling portion forming portion is open;

a third step of deforming the flat portions of each second intermediate product so that the flat portions move toward the direction toward which the coupling portion forming portion is open, to thereby produce a third intermediate product for each of the upper and lower structural members, which product is larger in bending depth of the coupling portion forming portion and smaller in width of the flat portions than the first intermediate product;

a fourth step of bending portions of the flat portions of each third intermediate product located on the side toward the coupling portion forming portion so that the bent portions form acute angles in relation to opposite side walls of the coupling portion forming portion and form obtuse angles in relation to outer portions of the flat portions, to thereby produce a fourth intermediate product for each of the upper and lower structural members, which product includes a coupling portion forming portion, sloping flat portions extending from the opposite side walls of the coupling portion forming portion, and narrow flat portions extending from distal edges of the sloping flat portions, being located on the common plane, and being narrower than the flat portions of the third intermediate product;

a fifth step of pushing the sloping flat portions of each fourth intermediate product, in a direction away from a bottom portion of the coupling portion forming portion, toward the side walls of the coupling portion forming portion, while restraining distal edge portions of the narrow flat portions, so as to move material of the intermediate product to boundaries between the sloping flat portions and the side walls of the coupling portion forming portion, to thereby produce a fifth intermediate product for each of the upper and lower structural members;

a sixth step of pressing, from upper and lower sides, opening-side portions of the side walls of the coupling portion forming portion, the sloping flat portions, and the narrow flat portions of each fifth intermediate product, to thereby produce a sixth intermediate product for each of the upper and lower structural members which product includes a coupling portion forming portion having the same depth as the upper and lower structural members of the final shape, and final flat portions extending from the opposite side walls of the coupling portion forming portion and being identical in shape and dimension with the upper and lower structural members of the final shape, wherein burrs project toward the interior of the coupling portion forming portion from opening-side end portions of the side walls of the coupling portion forming portion; and a seventh step of removing the burrs from each sixth intermediate product, to thereby produce the upper and lower structural members of the final shape each of which includes a coupling portion forming portion which is to come into close contact with an outer circumferential surface of a pipe, and the final flat portions which are integrally formed along opposite side edges of the coupling portion forming portion and are located on the common plane, wherein edge portions are formed at boundaries between the inner circumferential surface of the coupling portion forming portion and surfaces of the final flat portions, the surfaces facing a direction toward which the coupling portion forming portion is open.

4. A method of manufacturing casing structural members according to claim 3, wherein the direction in which the sloping flat portions are pushed in the fifth step inclines 5 to 20 degrees in relation to the plane on which the narrow flat portions are located.

5. A method of manufacturing a pipe coupling that prevents leakage comprising the steps of:

forming a semi-tubular portion and flat portions along opposite sides of the semi-tubular portion;

deforming the flat portions to produce larger bending depth and smaller width;

bending portions of the flat portions to form bent portions so that the bent portions form acute angles in relation to the semi-tubular portion with sloping flat portions extending from the semi-tubular portion, and distal narrow flat portions;

pushing the sloping flat portions away from the semi-tubular portion;

pressing the semi-tubular portion, the sloping flat portions, and the narrow flat portions to produce a final shape having final flat portions; and removing burrs so that the semi-tubular portion of the final shape comes into close contact with an outer circumferential surface of a pipe, and the final flat portions are integrally formed along opposite side edges of the semi-tubular portion in a common plane.

6. A method of manufacturing a pipe coupling component according to claim 5, further comprising the step of providing two dies, wherein each die has a shape corresponding to a final shape of a first intermediate product, the first intermediate product including the semi-tubular portion, and the flat portions which are integrally formed along opposite side edges of the semi-tubular portion and are located on a common plane, wherein round portions are formed at boundaries between an inner circumferential surface of the semi-tubular portion and surfaces of the flat portions, the surfaces facing a direction toward which the semi-tubular portion is open.

7. A method of manufacturing a pipe coupling component according to claim 5, wherein the flat portions are deformed so that the flat portions move toward a direction toward which the semi-tubular portion is open.

8. A method of manufacturing a pipe coupling component according to claim 5, further comprising the step of restraining distal edge portions of the narrow flat portions, so as to move material of the two boundaries between the sloping flat portions and the side walls of the semi-tubular portion while the pushing step is performed.

9. A method of manufacturing a pipe coupling component according to claim 5, wherein the pressing step includes pressing, from upper and lower sides, opening-side portions of the side walls of the semi-tubular portion, the sloping flat portions, and the narrow flat portions.

10. A method of manufacturing a pipe coupling component according to claim 5, further including the step of forming edge portions at boundaries between the inner circumferential surface of the semi-tubular portion and surfaces of the final flat portions, the surfaces facing a direction toward which the semi-tubular portion is open.

11. A method of manufacturing a pipe coupling component according to claim 5, wherein a direction in which the sloping flat portions are pushed inclines 5 to 20 degrees in relation to the plane on which the narrow flat portions are located.

\* \* \* \* \*